US012317658B2

(12) United States Patent
Lee et al.

(10) Patent No.: US 12,317,658 B2
(45) Date of Patent: May 27, 2025

(54) DISPLAY DEVICE

(71) Applicant: Samsung Display Co., LTD., Yongin-si (KR)

(72) Inventors: Hyun Wook Lee, Suwon-si (KR); Myeong Hun Song, Pyeongtaek-si (KR); Jong Chan Lee, Suwon-si (KR); Sung Won Jo, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 666 days.

(21) Appl. No.: 17/528,529

(22) Filed: Nov. 17, 2021

(65) Prior Publication Data

US 2022/0254970 A1 Aug. 11, 2022

(30) Foreign Application Priority Data

Feb. 5, 2021 (KR) .................. 10-2021-0016610

(51) Int. Cl.
*H10H 20/857* (2025.01)
*H01L 23/00* (2006.01)
(Continued)

(52) U.S. Cl.
CPC .......... *H10H 20/857* (2025.01); *H01L 24/24* (2013.01); *H01L 24/82* (2013.01);
(Continued)

(58) Field of Classification Search
CPC ..... H01L 33/62; H01L 24/24; H01L 24/2482; H01L 25/0753; H01L 33/38; H01L 33/40;
(Continued)

(56) References Cited

U.S. PATENT DOCUMENTS

2015/0097182 A1* 4/2015 Park ................... H01L 29/7869
257/43
2015/0144923 A1 5/2015 Choo et al.
(Continued)

FOREIGN PATENT DOCUMENTS

KR 10-2015-0040569 4/2015
KR 10-2015-0061579 6/2015
(Continued)

OTHER PUBLICATIONS

International Search Report corresponding to International Application No. PCT/KR2022/001451 dated May 9, 2022.
(Continued)

*Primary Examiner* — Richard A Booth
(74) *Attorney, Agent, or Firm* — KILE PARK REED & HOUTTEMAN PLLC

(57) ABSTRACT

A display device includes a first electrode and a second electrode disposed on a substrate, the first and second electrodes extending in a first direction in parallel to each other, a first insulating layer disposed on the first and second electrodes, light-emitting elements disposed on the first insulating layer, the light-emitting elements including first end portions disposed on the first electrode and second end portions disposed on the second electrode, an oxide semiconductor layer disposed on the first insulating layer and the light-emitting elements, the oxide semiconductor layer including a first conductive portion electrically contacting the first end portions of the light-emitting elements, a second conductive portion electrically contacting the second end portions of the light-emitting elements, and a semiconductive portions disposed between the first and second conductive portions, and a second insulating layer disposed on the oxide semiconductor layer.

13 Claims, 18 Drawing Sheets

(51) Int. Cl.
  *H01L 25/075* (2006.01)
  *H01L 25/16* (2023.01)
  *H10H 20/01* (2025.01)
  *H10H 20/825* (2025.01)
  *H10H 20/831* (2025.01)
  *H10H 20/832* (2025.01)
(52) U.S. Cl.
  CPC ....... *H01L 25/0753* (2013.01); *H10H 20/831* (2025.01); *H10H 20/832* (2025.01); *H01L 24/25* (2013.01); *H01L 24/95* (2013.01); *H01L 25/167* (2013.01); *H01L 2224/24147* (2013.01); *H01L 2224/245* (2013.01); *H01L 2224/25175* (2013.01); *H01L 2224/82101* (2013.01); *H01L 2224/82106* (2013.01); *H01L 2224/82909* (2013.01); *H01L 2224/95145* (2013.01); *H10H 20/032* (2025.01); *H10H 20/0364* (2025.01); *H10H 20/8252* (2025.01)
(58) Field of Classification Search
  CPC ....... H01L 24/25; H01L 24/95; H01L 25/167; H01L 33/325
  See application file for complete search history.

(56) References Cited

U.S. PATENT DOCUMENTS

| | | |
|---|---|---|
| 2017/0154898 A1 | 6/2017 | Park et al. |
| 2018/0012876 A1 | 1/2018 | Kim et al. |
| 2021/0013190 A1 | 1/2021 | Kim et al. |
| 2021/0376210 A1 | 12/2021 | Lee et al. |
| 2022/0140186 A1* | 5/2022 | Min ................... H01L 25/167 257/79 |

FOREIGN PATENT DOCUMENTS

| | | |
|---|---|---|
| KR | 10-2017-0010919 | 2/2017 |
| KR | 10-2018-0007025 | 1/2018 |
| KR | 10-2020-0102615 | 9/2020 |

OTHER PUBLICATIONS

Written Opinion corresponding to International Application No. PCT/KR2022/001451, dated May 9, 2022.

* cited by examiner

DISPLAY DEVICE

CROSS-REFERENCE TO RELATED APPLICATION(S)

This application claims priority to and the benefit of Korean Patent Application No. 10-2021-0016610 under 35 U.S.C. § 119, filed in the Korean Intellectual Property Office (KIPO) on Feb. 5, 2021, the entire contents are incorporated herein by reference.

BACKGROUND

1. Technical Field

The disclosure relates to a display device.

2. Description of Related Art

Display devices are becoming more important with developments in multimedia technology. Accordingly, various display devices such as an organic light-emitting diode (OLED) display device, or a liquid crystal display (LCD) device, and the like have been used.

Typically, a display device, which displays an image, includes a display panel such as an OLED display panel or an LCD panel. The display panel, particularly, a light-emitting element display panel, may include light-emitting elements. For example, light-emitting diodes (LEDs) may include OLEDs using an organic material as a fluorescent material and inorganic light-emitting diodes (ILEDs) using an inorganic material as a fluorescent material.

SUMMARY

Embodiments of the disclosure provide a display device capable of simplifying its manufacturing process through the self-alignment of electrodes and preventing short circuits that may be caused by the misalignment of the electrodes.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, the display device may comprise a first electrode and a second electrode disposed on a substrate, the first and second electrodes extending in a first direction in parallel to each other, a first insulating layer disposed on the first and second electrodes, light-emitting elements disposed on the first insulating layer, the light-emitting elements including first end portions disposed on the first electrode and second end portions disposed on the second electrode, an oxide semiconductor layer disposed on the first insulating layer and the light-emitting elements, the oxide semiconductor layer including a first conductive portion electrically contacting the first end portions of the light-emitting elements, a second conductive portion electrically contacting the second end portions of the light-emitting elements, and a semiconductive portions disposed between the first and second conductive portions, and a second insulating layer disposed on the oxide semiconductor layer.

In an embodiment, the first conductive portion, the second conductive portion, and the semiconductive portion may overlap the light-emitting elements and may be integral with each other.

In an embodiment, an oxygen content of each of the first and second conductive portions may be lower than an oxygen content of the semiconductive portion.

In an embodiment, the first and second conductive portions may be spaced apart from each other, and the semiconductive portion may be disposed between the first and second conductive portions.

In an embodiment, the first conductive portion, the second conductive portion, and the semiconductive portion may have a same length in the first direction.

In an embodiment, a length of each of the first and second conductive portions in the first direction may be greater than a length of the semiconductive portion in the first direction.

In an embodiment, a width of the first and second conductive portions in a second direction may be greater than a width of the semiconductive portion in the second direction, and the second direction may be a direction that intersects the first direction.

In an embodiment, the width of the semiconductive portion may be smaller than a length of the light-emitting elements.

In an embodiment, the semiconductive portion may overlap the second insulating layer, and the semiconductive portion may not overlap the first end portions and the second end portions of the light-emitting elements.

In an embodiment, a planar size of the semiconductive portion may be equal to a planar size of the second insulating layer.

In an embodiment, each of the first and second conductive portions may not overlap the second insulating layer.

In an embodiment, the display device may further comprise first banks overlapping the first and second electrodes and extending in the first direction, and a second bank defining an emission area where the light-emitting elements are disposed and a subarea spaced apart from the emission area in the first direction. The first and second conductive portions may be disposed in and across the emission area and the subarea.

In an embodiment, the semiconductive portion may be disposed in the emission area, and the semiconductive portion may not be disposed in the subarea.

According to an embodiment of the disclosure, the display device may comprise a first electrode and a second electrode disposed on a substrate, the first and second electrodes extending in a first direction in parallel to each other, a third electrode disposed between the first and second electrodes, a first insulating layer disposed on the first, second, and third electrodes, first light-emitting elements disposed on the first insulating layer and the first and third electrodes, and second light-emitting elements disposed on the first insulating layer and the second and third electrodes, an oxide semiconductor layer including a first conductive portion disposed on the first electrode, a second conductive portion disposed on a second side of the third electrode, a third conductive portion disposed on a first side of the third electrode and on the second electrode, a first semiconductive portion disposed on the first light-emitting elements, and a second semiconductive portion disposed on the second light-emitting elements, and a second insulating layer disposed on the oxide semiconductor layer.

In an embodiment, the third conductive portion may include a first extension extending in the first direction and overlapping the third electrode, a second extension overlapping the second electrode, and a connector extending in a second direction intersecting the first direction and electrically connecting the first and second extensions.

In an embodiment, the first conductive portion and the first extension may be adjacent to each other and face each other, the first semiconductive portion may be disposed between the first conductive portion and the first extension, the second conductive portion and the second extension may be adjacent to, and face, each other, and the second semiconductive portion may be disposed between the second conductive portion and the second extension.

In an embodiment, the second insulating layer may include a first insulating portion overlapping the first semiconductive portion, and a second insulating portion overlapping the second semiconductive portion, and the first and second insulating portions may be spaced apart from each other.

In an embodiment, the first conductive portion may electrically contact the first end portions of the first light-emitting elements, the first extension may electrically contact the second end portions of the first light-emitting elements, the second conductive portion may electrically contact the first end portions of the second light-emitting elements, and the second extension may electrically contact the second end portions of the second light-emitting elements.

In an embodiment, an oxygen content of each of the first, second, and third conductive portions may be lower than an oxygen content of each of the first and second semiconductive portions.

In an embodiment, the first, second, and third conductive portions and the first and second semiconductive portions may be integral with each other.

According to the aforementioned and other embodiments of the present disclosure, as portions of an oxide semiconductor layer are metallized by dry-etching a second insulating layer on the oxide semiconductor layer, the oxide semiconductor layer may be used as an electrode. Thus, the manufacturing cost of a display device can be reduced by reducing the number of mask processes.

Also, as conductors obtained by metallizing portions of the oxide semiconductor layer are self-aligned, any misalignment or any short circuit that may occur during the patterning of electrodes to be in contact with both end portions of each light-emitting element can be prevented.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 1:
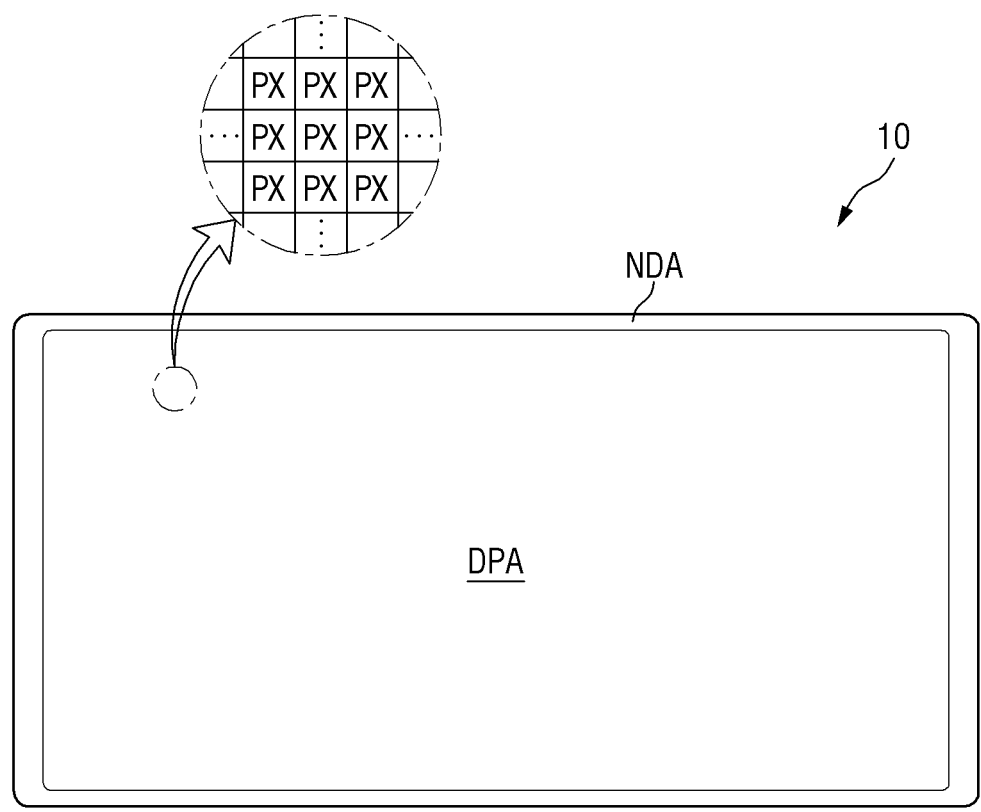
FIG. 1 is a schematic plan view of a display device according to an embodiment of the disclosure.

FIG. 1 is a schematic plan view of a display device according to an embodiment.

Referring to FIG. 1, a display device 10 displays a moving or still image. The display device 10 may refer to nearly all types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display image. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the disclosure is not limited thereto.

First, second, and third directions DR1, DR2, and DR3 are defined in the accompanying drawings. The first and second directions DR1 and DR2 may be perpendicular to each other in a single plane. The third direction DR3 may be perpendicular to the plane defined by the first and second directions DR1 and DR2. The third direction DR3 may be perpendicular to each of the first and second directions DR1 and DR2. The third direction DR3 may refer to the thickness direction of the display device 10.

The shape of the display device 10 may vary. In an embodiment, the display device 10 may have a rectangular shape that extends longer in the first direction DR1 than in the second direction DR2 in a plan view. In another embodiment, the display device 10 may have a rectangular shape that extends longer in the second direction DR2 than in in the first direction DR1 in a plan view. However, the disclosure is not limited thereto. For example, the display device 10 may have various other shapes such as a square shape, a tetragonal shape with rounded corners, a non-tetragonal polygonal shape, or a circular shape in a plan view. A display area DPA of the display device 10 may have a similar shape to the display device 10. FIG. 1 illustrates that the display device 10 and the display area DPA have a rectangular shape that extends longer in the first direction DR1 than in the second direction DR2.

The display device 10 may include the display area DPA and a non-display area NDA. The display area DPA is an area in which an image is displayed, and the non-display area NDA is an area in which an image is not displayed. The display area DPA may also be referred to as an active area, and the non-display area NDA may also be referred to as an inactive area. The display area DPA may generally account for a middle portion of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombic shape that has respective sides inclined with respect to a direction. The pixels PX may be alternately arranged in a stripe or Pen-Tile® fashion. Each of the pixels PX may include one or more light-emitting elements that emit light of a predetermined wavelength range to emit light of a predetermined color.

The non-display area NDA may be disposed on the periphery of the display area DPA. The non-display area NDA may surround the entire display area DPA or portion of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
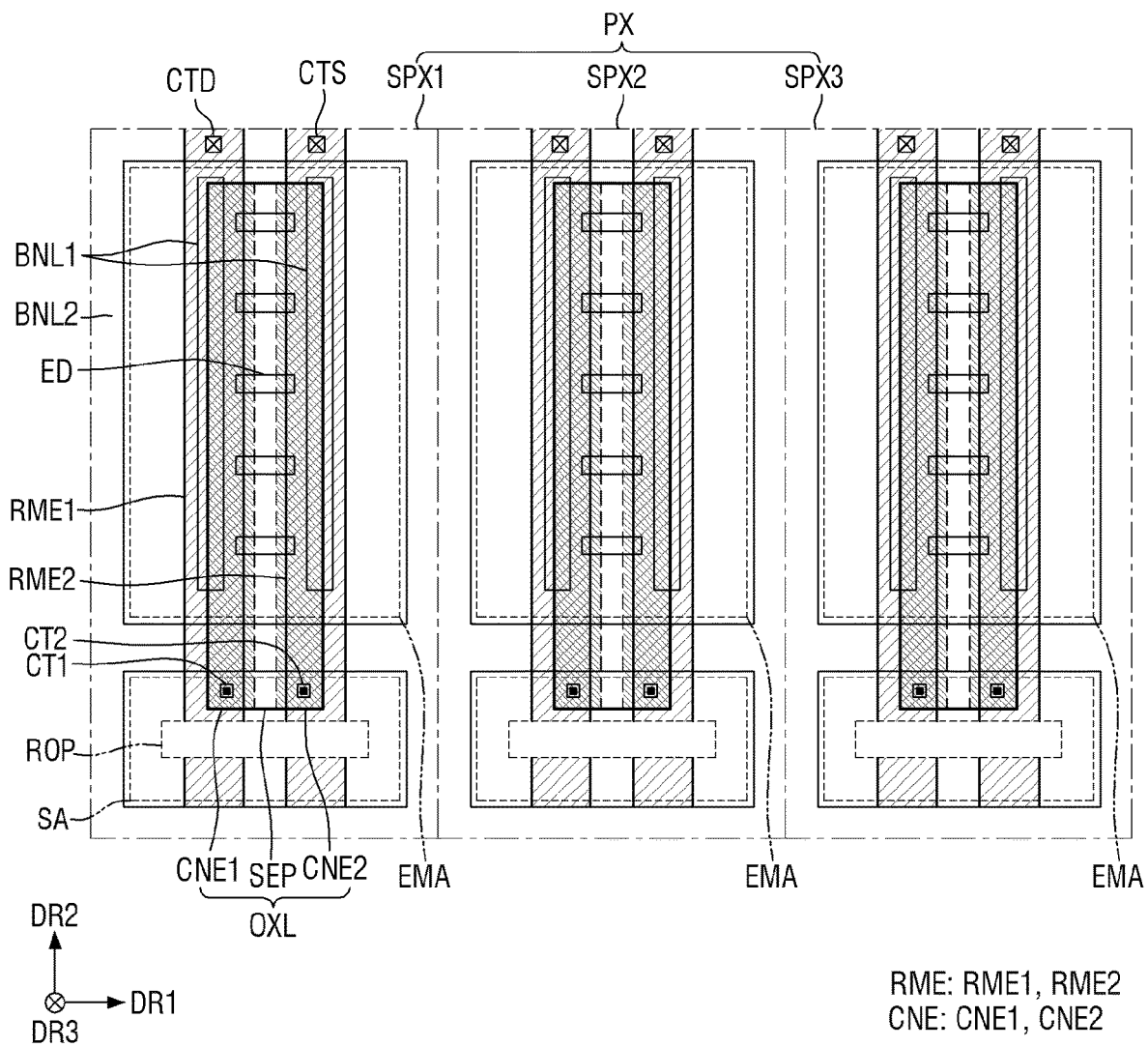
FIG. 2 is a schematic plan view of a pixel of the display device of FIG. 1.

FIG. 2 is a schematic plan view of a pixel of the display device 10 of FIG. 1.

Referring to FIG. 2, a pixel PX of the display device 10 may include subpixels SPXn (where n is between 1 and 3). In an embodiment, the pixel PX may include first, second, and third subpixels SPX1, SPX2, and SPX3. The first subpixel SPX1 may emit light of a first color, the second subpixel SPX2 may emit light of a second color, and the third subpixel SPX3 may emit light of a third color. The first, second, and third colors may be blue, green, and red, respectively, but the disclosure is not limited thereto. As another example, the subpixels SPXn may emit light of the same color, for example, blue light. FIG. 2 illustrates that the pixel PX includes three subpixels SPXn, but the disclosure is not limited thereto. As another example, the pixel PX may include more than three subpixels SPXn.

The subpixels SPXn may include emission areas EMA and non-emission areas. The emission areas EMA may be areas in which one or more light-emitting elements ED are disposed to emit light of a particular wavelength range, and the non-emission areas may be areas that are not reached by light emitted from the light-emitting elements ED and thus do not emit light. Each of the emission areas EMA may include an area in which one or more light-emitting elements ED are disposed and an area that outputs light emitted from the light-emitting elements ED.

However, the disclosure is not limited to this. Each of the emission areas EMA may further include an area in which light emitted from the light-emitting elements ED is reflected or refracted by another element. Light-emitting elements ED may be disposed in each of the subpixels SPXn, and the emission area EMA may be formed in each of the subpixels SPXn to include an area where the light-emitting elements ED are disposed and the surroundings of the area where the plurality of light-emitting elements ED are disposed.

FIG. 2 illustrates that the emission areas EMA have substantially the same size, but the disclosure is not limited thereto. As another example, the emission areas EMA may have different sizes depending on the color or wavelength of light emitted by the light-emitting element(s) ED disposed therein.

The subpixels SPXn may further include subareas SA, which are disposed in the non-emission areas. The subareas SA may be disposed opposite to their respective emission areas EMA in the second direction DR2 and may be disposed between the emission areas EMA of pairs of adjacent subpixels SPXn in the second direction DR2. In an embodiment, the emission areas EMA and the subareas SA may be alternately arranged in the second direction DR2 or in the opposite direction of the second direction DR2, but the disclosure is not limited thereto. The emission areas EMA and the subareas SA may have a different pattern of arrangement from that illustrated in FIG. 2. Referring to the pixel PX of FIG. 2, an emission area EMA and a subarea SA disposed directly below the emission area EMA in the opposite direction of the second direction DR2 may be included in a subpixel SPXn, and the emission area EMA may be adjacent to a subarea SA of a neighboring subpixel SPXn in the second direction DR2.

A second bank BNL2 may be disposed between the subareas SA and the emission areas EMA, and the distance between the subareas SA and the emission areas EMA may vary depending on the width of the second bank BNL2. No light-emitting elements ED are disposed in the subareas SA so that no light is emitted from the subareas SA, but portions of electrodes (e.g., RME1 and RME2) of each of the subpixels SPXn may be disposed in the subarea SA of the corresponding subpixel SPXn. Groups of electrodes (RME1 and RME2) of two different subpixels SPXn may be disposed to be separated from each other by a separation part ROP of one of the subareas SA of two different subpixels SPXn.

The second bank BNL2 may include parts that extend in the first direction DR1 and parts that extend in the second direction DR2 and may thus be arranged in a lattice pattern over the entire surface of the display area DPA in a plan view. The second bank BNL2 may be disposed along the boundaries of each of the subpixels SPXn to separate the subpixels SPXn from each other. Also, the second bank BNL2 may be disposed to surround the emission areas EMA of the subpixels SPXn to separate the emission areas EMA of the subpixels SPXn from one another.

The pixel PX or each of the subpixels SPXn may include a pixel driving circuit. The above-described lines may pass through or pass by the pixel PX to apply driving signals to the pixel driving circuit. The pixel driving circuit may include transistors and capacitors. The numbers of transistors and capacitors of the pixel driving circuit may vary. In an embodiment, the pixel driving circuit may have a "3T1C" structure that includes three transistors and a capacitor. The pixel driving circuit will hereinafter be described as having, for example, the "3T1C" structure, but various other structures such as a "2T1C", "7T1C", or "6T1C" structure may be applicable to the pixel driving circuit.

Figure 3:
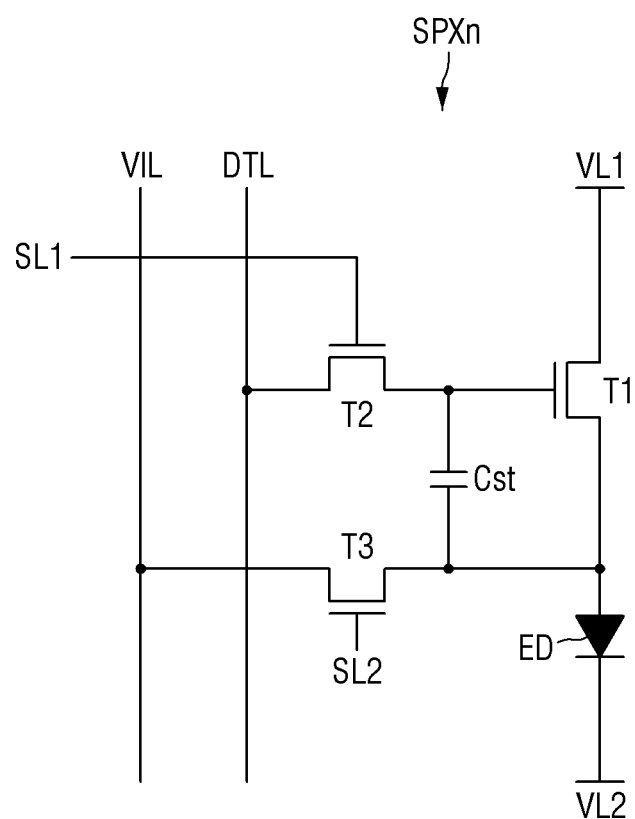
FIG. 3 is a schematic equivalent circuit diagram of a subpixel of the display device of FIG. 1.

FIG. 3 is a schematic equivalent circuit diagram of a subpixel SPXn of the display device 10 of FIG. 1.

Referring to FIG. 3, a subpixel SPXn of the display device 10 includes a light-emitting element ED and further includes three transistors, for example, first, second, and third transistors T1, T2, and T3, and a storage capacitor Cst.

The light-emitting element ED emits light in accordance with a current supplied thereto through the first transistor T1. The light-emitting element ED may emit light of a predetermined wavelength range in response to electrical signals being applied thereto from first and second electrodes that are electrically connected to both ends of the light-emitting element ED.

A first end of the light-emitting element ED may be electrically connected to a source electrode of the first transistor T1, and a second end of the light-emitting element ED may be electrically connected to a second voltage line VL2, to which a low-potential voltage (hereinafter, a second power supply voltage) lower than a high-potential voltage (hereinafter, a first power supply voltage) is supplied.

The first transistor T1 may adjust a current that flows from a first voltage line VL1, to which the first power supply voltage is supplied, to the light-emitting element ED in accordance with the difference in voltage between the gate electrode and the source electrode of the first transistor T1. In an embodiment, the first transistor T1 may be a driving transistor for driving the light-emitting element ED. The gate electrode of the first transistor T1 may be electrically connected to the source electrode of the second transistor T2, the source electrode of the first transistor T1 may be electrically connected to the first end of the light-emitting element ED, and the drain electrode of the first transistor T1 may be electrically connected to the first voltage line VL1, to which the first power supply voltage is supplied.

The second transistor T2 may be turned on by a scan signal from a first scan line SL1 to electrically connect a data line DTL to the gate electrode of the first transistor T1. The gate electrode of the second transistor T2 may be electrically connected to the first scan line SL1, the source electrode of the second transistor T2 may be electrically connected to the gate electrode of the first transistor T1, and the drain electrode of the second transistor T2 may be electrically connected to the data line DTL.

The third transistor T3 may be turned on by a scan signal from a second scan line SL2 to electrically connect an initialization voltage line VIL to the first end of the light-emitting element ED. A gate electrode of the third transistor T3 may be electrically connected to the second scan line SL2, the drain electrode of the third transistor T3 may be electrically connected to the initialization voltage line VIL, and the source electrode of the third transistor T3 may be electrically connected to the first end of the light-emitting element ED or the source electrode of the first transistor T1. The first and second scan lines SL1 and SL2 are illustrated as being separate, but the disclosure is not limited thereto. As another example, the first and second scan lines SL1 and SL2 may be formed as a single line, in which case, the second and third transistors T2 and T3 may be turned on at the same time by the same scan signal.

The source electrodes and the drain electrodes of the first, second, and third transistors T1, T2, and T3 are not limited to the above descriptions. The first, second, and third transistors T1, T2, and T3 may be formed as thin-film transistors. The first, second, and third transistors T1, T2, and T3 have been described as being, for example, N-type metal-oxide semiconductor field-effect transistors (MOSFETs), but the disclosure is not limited thereto. As another example, the first, second, and third transistors T1, T2, and T3 may be formed as P-type MOSFETs. In another embodiment, some of the first, second, and third transistors T1, T2, and T3 may be formed as N-type MOSFETs, and the other transistor(s) may be formed as P-type MOSFETs.

The storage capacitor Cst is formed between the gate electrode and the source electrode of the first transistor T1. The storage capacitor Cst stores a differential voltage between the gate voltage and the source voltage of the first transistor T1.

The structure of a pixel PX of the display device 10 will hereinafter be described.

Figure 4:
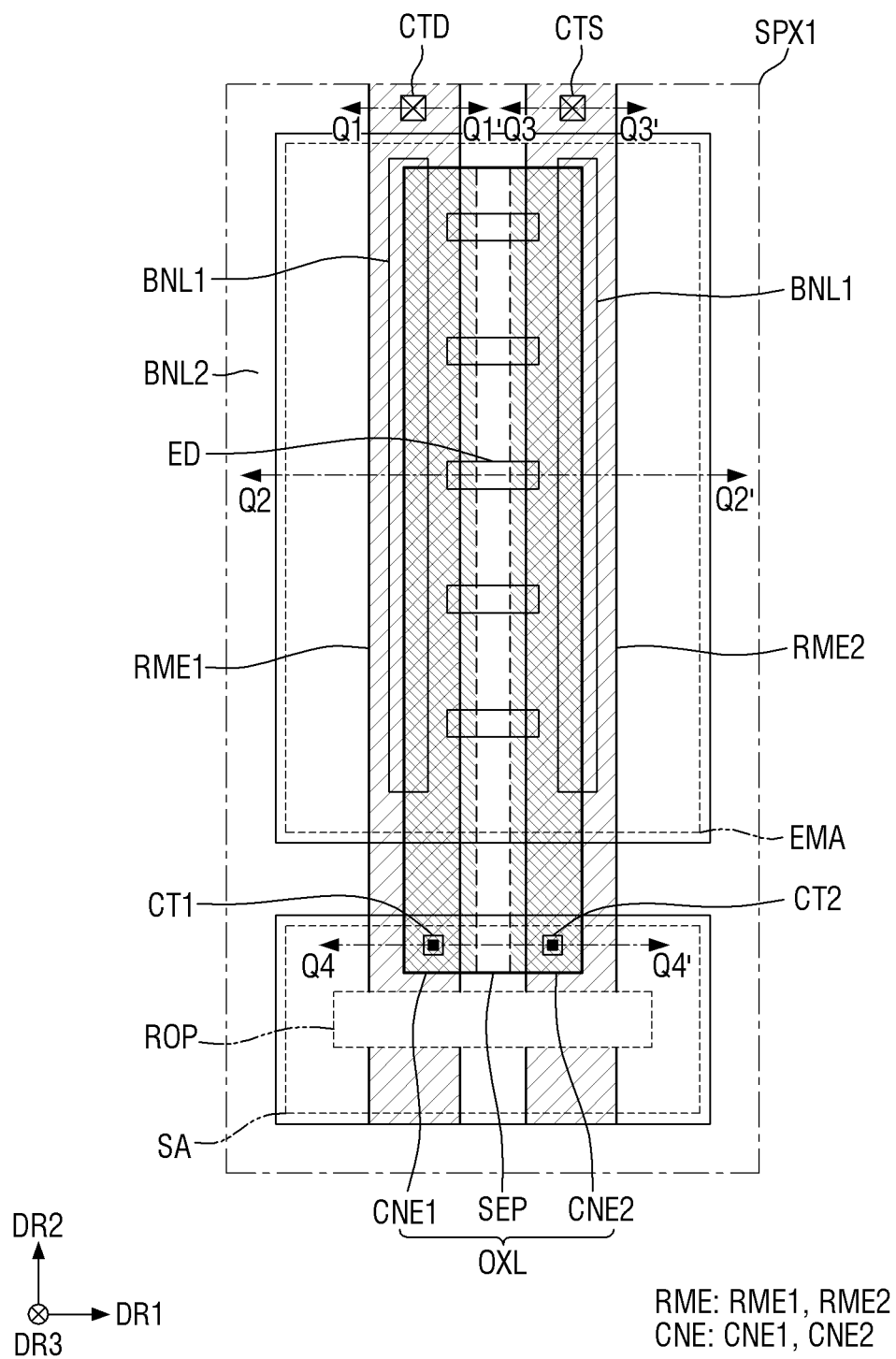
FIG. 4 is a schematic plan view of a first subpixel of FIG. 2.
Figure 5:
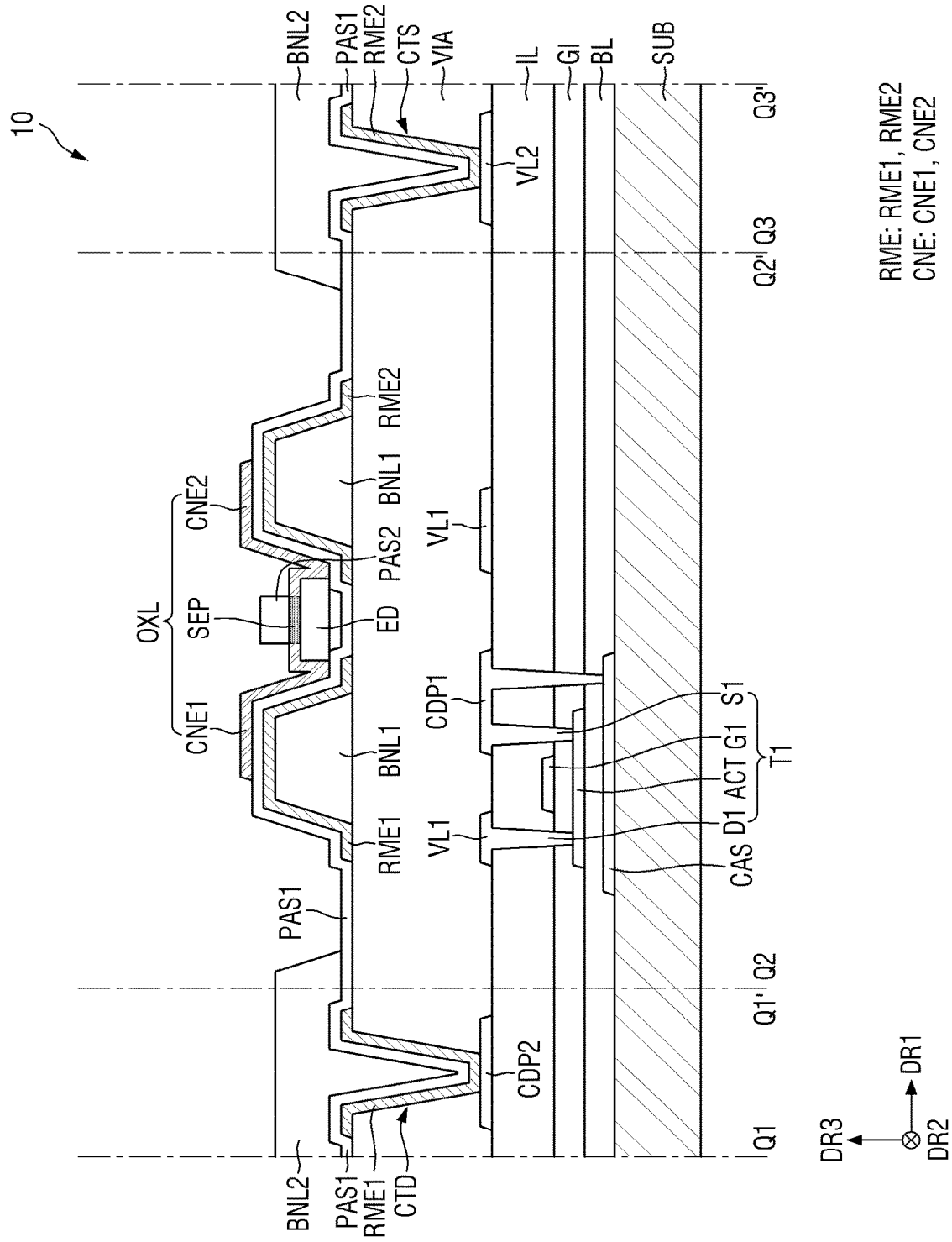
FIG. 5 is a schematic cross-sectional view taken along lines Q1-Q1', Q2-Q2', and Q3-Q3' of FIG. 4.
Figure 6:
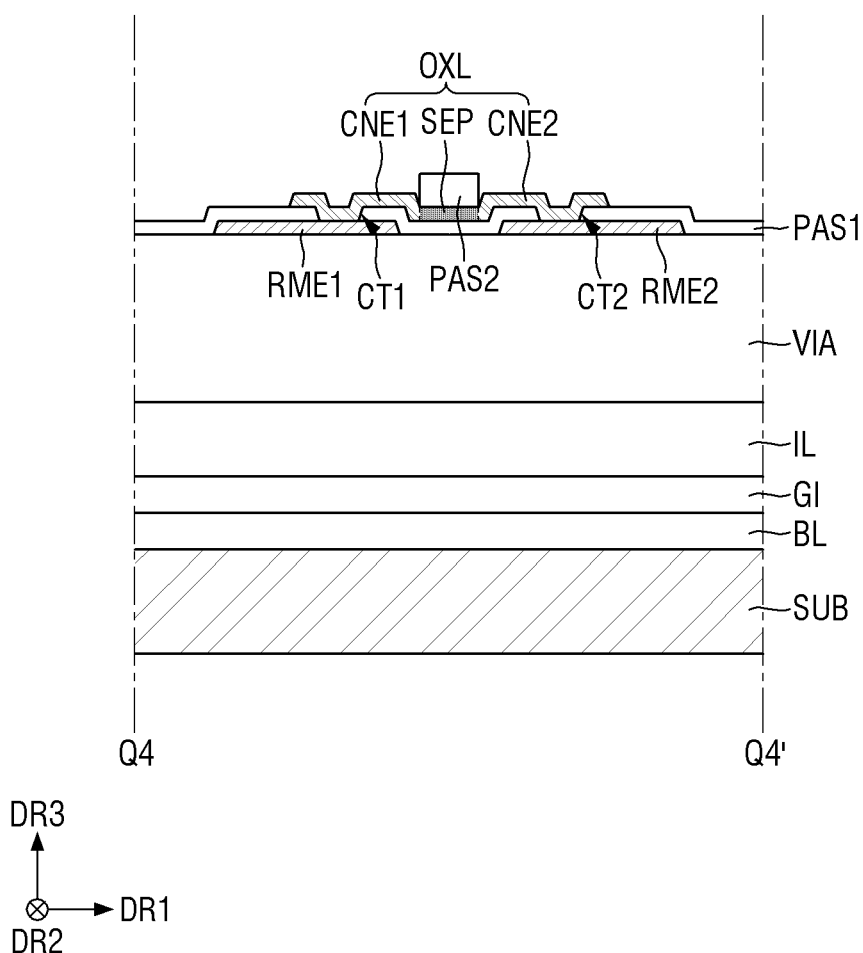
FIG. 6 is a schematic cross-sectional view taken along line Q4-Q4' of FIG. 4.
Figure 7:
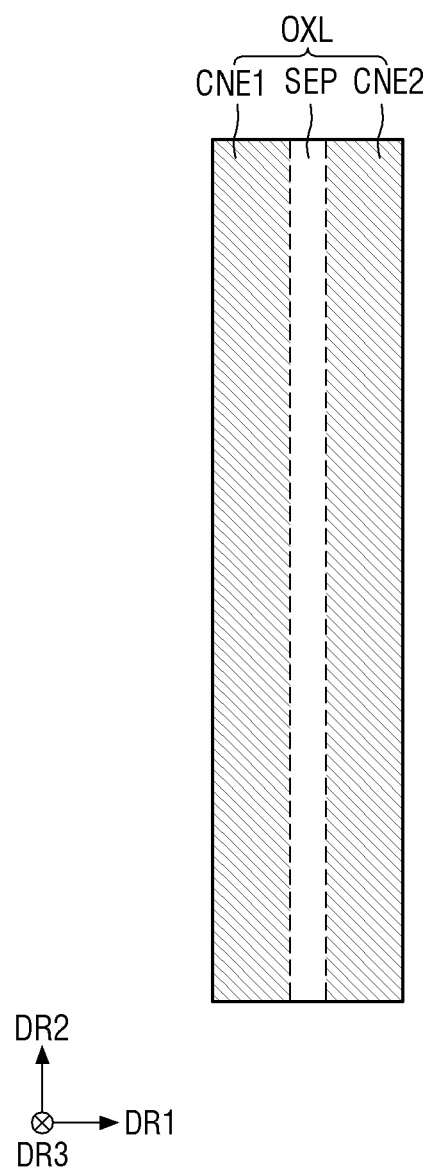
FIG. 7 is a schematic plan view of an oxide semiconductor layer of FIG. 4.

FIG. 4 is a schematic plan view of the first subpixel SPX1 of FIG. 2. FIG. 5 is a schematic cross-sectional view taken along lines Q1-Q1', Q2-Q2', and Q3-Q3' of FIG. 4. FIG. 6 is a schematic cross-sectional view taken along line Q4-Q4' of FIG. 4. FIG. 7 is a schematic plan view of an oxide semiconductor layer of FIG. 4.

Descriptions of elements or features that have already been described above with reference to FIG. 2 will be omitted or simplified.

Referring to FIGS. 4 to 7 and further to FIG. 2, the display device 10 may include a substrate SUB and a semiconductor layer, conductive layers, and insulating layers, which are disposed on the substrate SUB. The semiconductor layer, the conductive layers, and the insulating layers may form a transistor layer and a light-emitting element layer of the display device 10.

Specifically, the substrate SUB may be an insulating substrate. The substrate SUB may be formed of an insulating material such as glass, quartz, or a polymer resin. The substrate SUB may be a rigid substrate or may be a flexible substrate that is bendable, foldable, or rollable.

A first conductive layer may be disposed on the substrate SUB. The first conductive layer includes a lower metal layer CAS, and the lower metal layer CAS is disposed to overlap an active layer ACT of the first transistor T1. The lower metal layer CAS may include a material capable of blocking the transmission of light and may thus prevent light from being incident upon the active layer ACT of the first transistor T1. In some embodiments, the lower metal layer CAS may not be provided.

A buffer layer BL may be disposed on the lower metal layer CAS and the substrate SUB. The buffer layer BL may be formed on the substrate SUB to protect transistors from moisture that may penetrate through the substrate SUB, which is vulnerable to moisture, and may perform a surface planarization function.

The semiconductor layer is disposed on the buffer layer BF. The semiconductor layer may include the active layer ACT of the first transistor T1. The active layer ACT may be disposed to partially overlap a gate electrode G1 of the first transistor T1.

The semiconductor layer may include polycrystalline silicon, monocrystalline silicon, or an oxide semiconductor. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

FIGS. 4 to 7 illustrate that a first transistor T1 is disposed in a subpixel SPXn, for example, a first subpixel SPX1, but the disclosure is not limited thereto. As another example, the display device 10 may include more than a first transistor T1 in each subpixel SPXn.

A gate insulating layer GI is disposed on the semiconductor layer and the buffer layer BL. The gate insulating layer GI may function as a gate insulating film for the first transistor T1.

A second conductive layer is disposed on the gate insulating layer GI. The second conductive layer may include the gate electrode G1 of the first transistor T1. The gate electrode G1 of the first transistor T1 may be disposed to overlap the channel region of the active layer ACT in the third direction DR3, which is the thickness direction of the display device 10.

An interlayer insulating layer IL is disposed on the second conductive layer. The interlayer insulating layer IL may function as an insulating film between the second conductive layer and layers disposed on the second conductive layer and may protect the second conductive layer.

A third conductive layer is disposed on the interlayer insulating layer IL. The third conductive layer may include the first voltage line VL1, the second voltage line VL2, and conductive patterns, for example, first and second conductive patterns CDP1 and CDP2.

The high-potential voltage (or the first power supply voltage), which is to be transmitted to a first electrode RME1, may be applied to the first voltage line VL1, and the low-potential voltage (or the second power supply voltage), which is to be transmitted to a second electrode RME2, may be applied to the second voltage line VL2. A portion of the first voltage line VL1 may contact the active layer ACT of the first transistor T1 through a contact hole that penetrates the interlayer insulating layer IL and the gate insulating layer GI. The first voltage line VL1 may function as a first drain electrode D1 of the first transistor T1. The second voltage line VL2 may be directly electrically connected to the second electrode RME2.

The first conductive pattern CDP1 may contact the active layer ACT of the first transistor T1 through contact holes that penetrate the interlayer insulating layer IL and the gate insulating layer GI. The first conductive pattern CDP1 may contact the lower metal layer CAS through another contact hole. The first conductive pattern CDP1 may function as a first source electrode S1 of the first transistor T1.

The second conductive pattern CDP2 may be electrically connected to the first electrode RME1. Also, the second conductive pattern CDP2 may be electrically connected to the first transistor T1 via the first conductive pattern CDP1. The first and second conductive patterns CDP1 and CDP2 are illustrated as being separate. As another example, the first and second conductive patterns CDP1 and CDP2 may be integrated into a single pattern. The first transistor T1 may transmit the first power supply voltage, applied thereto from the first voltage line VL1, to the first electrode RME1.

The first and second conductive patterns CDP1 and CDP2 are illustrated as being formed in the same layer, but the disclosure is not limited thereto. As another example, the second conductive pattern CDP2 may be formed of (or include) a different conductive layer from the first conductive pattern CDP1, for example, a fourth conductive layer disposed on the third conductive layer with a number of insulating layers interposed therebetween. In this case, the first and second voltage lines VL1 and VL2 may be formed of the fourth conductive layer, rather than the third conductive layer, and the first voltage line VL1 may be electrically connected to the first drain electrode D1 of the first transistor T1 via another conductive pattern.

Each of the buffer layer BL, the gate insulating layer GI, and the interlayer insulating layer IL may include inorganic layers that are alternately stacked. In an embodiment, each of the buffer layer BL, the gate insulating layer GI, and the interlayer insulating layer IL may be formed as a double layer in which inorganic layers including at least one of silicon oxide ($SiO_x$), silicon nitride ($SiN_x$), and silicon oxynitride ($SiO_xN_y$) are alternately stacked, or as a multilayer in which the inorganic layers are alternately stacked, but the disclosure is not limited thereto. In another embodiment, each of the buffer layer BL, the gate insulating layer GI, and the interlayer insulating layer IL may be formed as an inorganic layer including an insulating material such as $SiO_x$, $SiN_x$, and $SiO_xN_y$. In some embodiments, each of the buffer layer BL, the gate insulating layer GI, and the interlayer insulating layer IL may be formed of an organic insulating material such as polyimide (PI).

Each of the second and third conductive layers may be formed as a single layer or a multilayer including molybdenum (Mo), aluminum (Al), chromium (Cr), gold (Au), titanium (Ti), nickel (Ni), neodymium (Nd), copper (Cu), or an alloy thereof, but the disclosure is not limited thereto.

A via layer VIA is disposed on the third conductive layer. The via layer VIA may include an organic insulating material such as PI and may perform a surface planarization function.

Electrodes RME, e.g., the first and second electrodes RME1 and RME2, first banks BNL1, the second bank BNL2, light-emitting elements ED, and conductive portions CNE, e.g., first and second conductive portions CNE1 and CNE2, are disposed on the via layer VIA as a display element layer. Insulating layers, e.g., first and second insulating layers PAS1 and PAS2, may be disposed on the via layer VIA.

The first banks BNL1 may be disposed directly on the via layer VIA. The first banks BNL1 may be disposed in an emission area EMA of the first subpixel SPXn, may extend in the second direction DR2, and may be spaced apart from each other in the first direction DR1. The first banks BNL1 may have the same width, but the disclosure is not limited thereto. As another example, the first banks BNL1 may have different widths. The length, in the second direction DR2, of the first banks BNL1 may be smaller than the length, in the second direction DR2, of the emission area EMA surrounded by the second bank BNL2. The first banks BNL1 may form an island pattern that extends in a direction with a small width, in the emission area EMA of the first subpixel SPX1, over the entire surface of the display area DPA. Light-emitting elements ED may be disposed between the first banks BNL1 that are spaced from each other.

The first banks BNL1 may protrude at least in part from the top surface of the via layer VIA. A protruding portion of each of the first banks BNL1 may have inclined or curved side surfaces. As another example, each of the first banks BNL1 may have a semicircular or semielliptical shape in a cross-sectional view. The first banks BNL1 may include an organic insulating material such as PI, but the disclosure is not limited thereto.

The electrodes RME may extend in a direction and may be disposed in the first subpixel SPX1. The electrodes RME may extend in the second direction DR2 and may be disposed in and across the emission area EMA and a subarea SA of the first subpixel SPX1. The electrodes RME may be spaced apart from each other in the first direction DR1. The display device 10 may include the first and second electrodes RME1 and RME2, which are disposed in the first subpixel SPX1. The first electrode RME1 may be disposed on the left side of the center of the emission area EMA of the first subpixel SPX1, and the second electrode RME2 may be spaced apart from the first electrode RME1 in the first direction DR1 and may be disposed on the right side of the center of the emission area EMA of the first subpixel SPX1.

The first electrode RME1 may be disposed at least in part on a first bank BNL1 on one side of the emission area EMA of the first subpixel SPX1, and the second electrode RME2 may be disposed in part on a first bank BNL1 on another (or the other side) of the emission area EMA of the first subpixel SPX1. The electrodes RME may be disposed on the inclined side surfaces of each of the first banks BNL1. In an embodiment, the width, in the first direction DR1, of the electrodes RME may be greater than the width, in the first direction DR1, of the first banks BNL1. The electrodes RME may be disposed to cover (or overlap) at least one side surface of each of the first banks BNL1 to reflect light emitted from the light-emitting elements ED. Also, the distance, in the first direction DR1, between the electrodes RME may be smaller than the distance, in the first direction DR1, between the first banks BNL1. The electrodes RME may be disposed, at least in part, directly on the via layer VIA to be placed on the same plane.

The first and second electrodes RME1 and RME2 may be electrically connected to the third conductive layer through first and second electrode contact holes CTD and CTS, respectively, which are formed in an area that overlaps the second bank BNL2. The first electrode RME1 may contact the second conductive pattern CDP2 through the first electrode contact hole CTD, which penetrates the via layer VIA. The second electrode RME2 may contact the second voltage line VL2 through the second electrode contact hole CTS, which penetrates the via layer VIA. The first electrode RME1 may be electrically connected to the first transistor T1 via the first and second conductive patterns CDP1 and CDP2 and may thus receive the first power supply voltage, and the second electrode RME2 may be electrically connected to the second voltage line VL2 and may thus receive the second power supply voltage. The first and second electrode contact holes CTD and CTS are illustrated as being disposed below the second bank BNL2, but the disclosure is not limited thereto. The first and second electrode contact holes CTD and CTS may be disposed in the emission area EMA or the subarea SA of the first subpixel SPX1.

Electrodes RME of a pair of adjacent subpixels SPXn in the second direction DR2 or the opposite direction of the second direction DR2, for example, the electrodes RME of the first subpixel SPX1 and the electrodes RME of a subpixel SPXn directly below the first subpixel SPX1, may be separated from each other by a separation part ROP of the subarea SA of the first subpixel SPX1. The electrodes RME may be obtained by forming single electrode lines that extend in the second direction DR2 and cutting up the single electrode lines after the alignment of the light-emitting elements ED. The electrode lines may be used to generate an electric field in the first subpixel SPX1 to align the light-emitting elements ED during the fabrication of the display device 10.

After the alignment of the light-emitting elements ED, the electrode lines may be cut up and separated by the separation part ROP, so that electrodes RME that are spaced apart from each other in the second direction DR2 may be formed. The separation of the electrode lines may be performed after the formation of the second insulating layer PAS2, and the second insulating layer PAS2 may not be disposed in the separation part ROP. The second insulating layer PAS2 may be used as a mask pattern during the separation of the electrode lines.

The electrodes RME may be electrically connected to the light-emitting elements ED. The electrodes RME may be electrically connected to the light-emitting elements ED through the conductive portions CNE and may transmit electrical signals applied thereto from the underlying conductive layers to the light-emitting elements ED.

The electrodes RME may include a conductive material with high reflectance. For example, the electrodes RME may include a metal with high reflectance such as silver (Ag), Cu, or Al or an alloy of Al, nickel (Ni), or lanthanum (La). The electrodes RME may reflect light, emitted from the light-emitting elements ED to travel toward the side surfaces of each of the first banks BNL1, in an upward direction of the first subpixel SPX1.

However, the disclosure is not limited thereto. The electrodes RME may further include a transparent conductive material. In an embodiment, the electrodes RME may include a material such as ITO, IZO, or ITZO. In some embodiments, the electrodes RME may have a structure in which one or more layers of a transparent conductive material and one or more layers of a metal with high reflectance are stacked or may be formed as a single layer including the transparent conductive material and the metal with high reflectance. For example, the electrodes RME may have a stack of ITO/Ag/ITO/, ITO/Ag/IZO, or ITO/Ag/ITZO/IZO.

The first insulating layer PAS1 is disposed on the via layer VIA, the first banks BNL1, and the electrodes RME. The first insulating layer PAS1 may be disposed to cover (or overlap) the electrodes RME and the first banks BNL1, over the via layer VIA. The first insulating layer PAS1 may not be disposed in the separation part ROP where the electrodes RME of the first subpixel SPX1 are spaced apart from the electrodes RME of the subpixel SPXn directly below the first subpixel SPX1. The first insulating layer PAS1 may protect the electrodes RME of the first subpixel SPX1 and may insulate the electrodes RME of the first subpixel SPX1 from the electrodes RME of the subpixel SPXn directly below the first subpixel SPX1. Also, the first insulating layer PAS1 may prevent the light-emitting elements ED from being damaged by contacting other elements.

In an embodiment, the first insulating layer PAS1 may be formed to have a top surface recessed in part between the electrodes RME that are spaced apart from each other in the first direction DR1. The light-emitting elements ED may be disposed on a recessed portion of the top surface of the first insulating layer PAS1, and a gap may be formed between the light-emitting elements ED and the first insulating layer PAS1.

The first insulating layer PAS1 may include contacts, e.g., first and second contacts CT1 and CT2, which expose portions of the top surfaces of the electrodes RME. The first and second contacts CT1 and CT2 may penetrate the first insulating layer PAS1, and the conductive portions CNE may contact exposed portions of the electrodes RME through the first and second contacts CT1 and CT2.

The second bank BNL2 may be disposed on the first insulating layer PAS1. The second bank BNL2 may include parts that extend in the first direction DR1 and parts that extend in the second direction DR2 and may thus be arranged in a lattice pattern over the entire surface of the display area DPA in a plan view. The second bank BNL2 may be disposed along the boundaries of the first subpixel SPX1 to separate the first subpixel SPX1 from other subpixels SPXn. Also, the second bank BNL2 may be disposed to surround the emission area EMA and the subarea SA of the first subpixel SPX1, and areas defined and opened by the second bank BNL2 may be the emission area EMA and the subarea SA of the first subpixel SPX1.

The second bank BNL2 may have a predetermined height. In some embodiments, the height of the top surface of the second bank BNL2 may be greater than the height of the top surfaces of the first banks BNL1, and the thickness of the second bank BNL2 may be greater than or equal to the thickness of the first banks BNL1. However, the disclosure is not limited thereto. As another example, the height of the top surface of the second bank BNL2 may be smaller than or equal to the height of the top surfaces of the first banks BNL1, and the thickness of the second bank BNL2 may be smaller than the thickness of the first banks BNL1. The second bank BNL2 may prevent ink from spilling over to neighboring subpixels SPXn during an inkjet printing during the fabrication of the display device 10. The second bank BNL2 may prevent ink having different groups of light-emitting elements ED for different subpixels SPXn from being mixed together. Similar to the first banks BNL1, the second bank BNL2 may include PI, but the disclosure is not limited thereto.

The light-emitting elements ED may be disposed on the first insulating layer PAS1. Each of the light-emitting elements ED may include layers that are arranged in a direction parallel to the top surface of the substrate SUB. The light-emitting elements ED may be disposed such that the direction in which the light-emitting elements ED extend may be parallel to the substrate SUB, and the semiconductor layers included in each of the light-emitting elements ED may be sequentially arranged in the direction parallel to the top surface of the substrate SUB. However, the disclosure is not limited thereto. As another example, in case that the light-emitting element ED has a different structure, the semiconductor layers may be sequentially arranged in a direction perpendicular to the substrate SUB.

The light-emitting elements ED may be disposed between the first banks BNL1 and on the electrodes RME that are spaced apart from each other in the first direction DR1. The light-emitting elements ED may be spaced apart from one another in the second direction DR2, in which the electrodes RME extend, and may be aligned substantially in parallel to one another. The light-emitting elements ED may extend in a direction, and the length of the light-emitting elements ED may be greater than the minimum distance between the electrodes RME that are spaced apart from each other in the first direction DR1. At least one end portion of each of the light-emitting elements ED may be disposed on one of the electrodes RME that are spaced apart from each other in the first direction DR1, or both end portions of each of the light-emitting elements ED may be disposed on different electrodes RME. The direction in which the electrodes RME extend may be substantially perpendicular to the direction in which the light-emitting elements ED extend, but the disclosure is not limited thereto. As another example, the light-emitting elements ED may be disposed diagonally with respect to the direction in which the electrodes RME extend.

Each of the light-emitting elements ED may include semiconductor layers and may emit light of different wavelength ranges depending on the materials of the semiconductor layers, but the disclosure is not limited thereto. As another example, the materials of the semiconductor layers of each of the light-emitting elements ED of different subpixels SPXn may be uniform, and thus the different subpixels SPXn may emit light of the same color. Also, as each of the light-emitting elements ED includes semiconductor layers that are doped with dopants of different conductivity types, the light-emitting elements ED may be aligned such that a first end portion of each of the light-emitting elements ED may be oriented to a predetermined direction by an electric field formed on the electrodes RME. First and second end portions of each of the light-emitting elements ED may be defined based on a semiconductor layer included in each of the light-emitting elements ED. In an embodiment, portions of the light-emitting elements ED on the first electrode RME1 may be defined as first end portions, and portions of the light-emitting elements ED on the second electrode RME2 may be defined as second end portions. In an embodiment where the display device 10 includes more than two electrodes RME in each subpixel SPXn, first end portions of light-emitting elements ED disposed on different electrodes RME may face different directions.

The light-emitting elements ED may contact, and electrically connected to, the conductive portions CNE. As some of the semiconductor layers of each of the light-emitting elements ED are exposed at least one end of each of the light-emitting elements ED, the exposed semiconductor layers may contact the conductive portions CNE. The light-emitting elements ED may be electrically connected to the electrodes RME and the conductive layers disposed below the via layer VIA through the conductive portions CNE and may thus be able to emit light of a predetermined wavelength in response to electrical signals being applied thereto.

An oxide semiconductor layer OXL may be disposed on the first insulating layer PAS1 and the light-emitting elements ED. The oxide semiconductor layer OXL may extend in the second direction DR2 from the emission area EMA to the subarea SA of the first subpixel SPX1. The oxide semiconductor layer OXL may be disposed in the first subpixel SPX1 to form an island pattern.

The oxide semiconductor layer OXL may be disposed to cover (or overlap) the light-emitting elements ED and may thus contact the entire outer surfaces of each of the light-emitting elements ED, except for portions of the outer surfaces of the light-emitting elements ED that contact the first insulating layer PAS1. Also, the oxide semiconductor layer OXL may be disposed to overlap the first banks BNL1 and the electrodes RME in the third direction DR3.

In an embodiment, the oxide semiconductor layer OXL may include the first conductive portion CNE1, the second conductive portion CNE2, and a semiconductive portion SEP, which are obtained by a metallization process. The first conductive portion CNE1, the second conductive portion CNE2, and the semiconductive portion SEP may be formed in a body (or may be integral with each other) as sections of the oxide semiconductor layer OXL.

The conductivity of the oxide semiconductor layer OXL may vary depending on the oxygen content of the oxide semiconductor layer OXL. Specifically, by appropriately controlling the oxygen content of a metal oxide semiconductor such as IGZO, the metal oxide semiconductor may be transformed to have the properties of a conductor or a semiconductor. An oxide semiconductor has the properties of a semiconductor, but as the oxygen content of the oxide semiconductor is lowered, the metallic properties of the oxide semiconductor may be strengthened so that the oxide semiconductor may have the properties of a conductor. The oxygen content of an oxide semiconductor may be lowered by plasma treatment. If plasma treatment is performed on an oxide semiconductor, oxygen may escape from the oxide semiconductor, and the resistance of the oxide semiconductor may decrease so that the oxide semiconductor may be metallized. As will be described below, portions of the oxide semiconductor layer OXL may be metallized by plasma treatment during the dry etching of the second insulating layer PAS2. The first and second conductive portions CNE1 and CNE2, which correspond to the metallized portions of the oxide semiconductor layer OXL, may have a lower oxygen content than the semiconductive portion SEP. In an embodiment, the first and second conductive portions CNE1 and CNE2 may be used as electrodes that contact the light-emitting elements ED, and the semiconductive portion SEP may be used as an insulator.

The conductive portions CNE may be disposed on the electrodes RME and the light-emitting elements ED. The conductive portions CNE may be spaced apart from each other by the semiconductive portion SEP, which are disposed between the conductive portions CNE. The conductive portions CNE may contact the light-emitting elements ED and the electrodes RME. The conductive portions CNE may directly contact the semiconductor layers exposed at both end surfaces of each of the light-emitting elements ED and may contact at least one of the electrodes RME through the first and second contacts CT1 and CT2. Both end portions of each of the light-emitting elements ED may be electrically connected to the electrodes RME via the conductive portions CNE.

The first conductive portion CNE1 may extend in the second direction DR2 and may be disposed on the first electrode RME1 and one of the first banks BNL1. Portions of the first conductive portion CNE1 may overlap the first electrode RME1 and one of the first banks BNL1, and other portions of the first conductive portion CNE1 may overlap the light-emitting elements ED. The first conductive portion CNE1 may contact the first electrode RME1 through the first contact CT1, which exposes the top surface of the first electrode RME1 and contact the first end portions of the light-emitting elements ED. Also, the first conductive portion CNE1 may extend to the subarea SA of the first subpixel SPX1 to be disposed in both the emission area EMA and the subarea SA of the first subpixel SPX1.

The second conductive portion CNE2 may extend in the second direction DR2 and may be disposed on the second electrode RME2 and the other first bank BNL1. Portions of the second conductive portion CNE2 may overlap the second electrode RME2 and the other first bank BNL1, and portions of the second conductive portion CNE2 may overlap the light-emitting elements ED. The second conductive portion CNE2 may contact the second electrode RME2 through the second contact CT2, which exposes the top surface of the second electrode RME2 and contact the second end portions of the light-emitting elements ED.

The first and second conductive portions CNE1 and CNE2 may transmit electrical signals, applied to the first and second electrodes RME1 and RME2, to the light-emitting elements ED. The electrical signals may be directly applied to the light-emitting elements ED. Also, the first and second conductive portions CNE1 and CNE2 may be spaced apart from each other in the first direction DR1 in a plan view. As the semiconductive portion SEP is disposed between the first and second conductive portions CNE1 and CNE2, the first and second conductive portions CNE1 and CNE2 may be insulated from each other not to directly contact each other. Electrical signals applied to the conductive portions CNE may flow through the light-emitting elements ED.

In an embodiment, the first and second conductive portions CNE1 and CNE2 may be disposed in the same layer. The first and second conductive portions CNE1 and CNE2 may be disposed directly on the first insulating layer PAS1 and the light-emitting elements ED.

The conductive portions CNE may contact the electrodes RME through the first and second contacts CT1 and CT2, which penetrate the first insulating layer PAS1. In an embodiment, the first and second contacts CT1 and CT2 may be formed to be spaced apart from a region where the light-emitting elements ED are disposed, in the second direction DR2, and thus not to overlap the light-emitting elements ED. The first and second contacts CT1 and CT2 are illustrated as being disposed in the subarea SA of the first subpixel SPX1, but the disclosure is not limited thereto. The first and second contacts CT1 and CT2 may be formed in portions of the emission area EMA where the light-emitting elements ED are not disposed.

The semiconductive portion SEP may be disposed on the first insulating layer PAS1 and the light-emitting elements ED and may cover (or overlap) the light-emitting elements ED. The semiconductive portion SEP may cover at least portions of the light-emitting elements ED. The semiconductive portion SEP may neither cover nor overlap both end portions of each of the light-emitting elements ED such that the conductive portions CNE may contact both the end portions of each of the light-emitting elements ED. The semiconductive portion SEP may have a predetermined width in the first direction DR1, and the width of the semiconductive portion SEP may be smaller than the length, in the first direction DR1, of the light-emitting elements ED.

The semiconductive portion SEP may extend in the second direction DR2 to be disposed in both the emission area EMA and the subarea SA of the first subpixel SPX1. The semiconductive portion SEP may be disposed not to overlap the electrodes RME and the first banks BNL1. The semiconductive portion SEP and the first and second conductive portions CNE1 and CNE2 may be disposed on the same layer, and the semiconductive portion SEP may be arranged between the first and second conductive portions CNE1 and CNE2 to separate the first and second conductive portions CNE1 and CNE2 from each other.

The first conductive portion CNE1, the second conductive portion CNE2, and the semiconductive portion SEP may have a predetermined length extended in the second direction DR2 and may all have the same length. In an embodiment, the oxide semiconductor layer OXL, which includes the first conductive portion CNE1, the second conductive portion CNE2, and the semiconductive portion SEP, may be formed in a rectangular shape that extends in the second direction DR2, but the disclosure is not limited thereto. In another embodiment, the oxide semiconductor layer OXL may be formed in a non-tetragonal polygonal shape.

The first conductive portion CNE1, the second conductive portion CNE2, and the semiconductive portion SEP may have a predetermined width in the first direction DR1, and the first and second conductive portions CNE1 and CNE2 may have the same width. The width of the semiconductive portion SEP may be smaller than the width of the first and second conductive portions CNE1 and CNE2, but the disclosure is not limited thereto. As another example, the width of the semiconductive portion SEP may be equal to or greater than the width of the first and second conductive portions CNE1 and CNE2.

The second insulating layer PAS2 may be disposed on the oxide semiconductor layer OXL. The second insulating layer PAS2 may overlap the semiconductor portion SEP of the oxide semiconductor layer OXL and may be disposed directly on the semiconductor portion SEP. Specifically, the second insulating layer PAS2 may completely overlap the semiconductor portion SEP, and the second insulating layer PAS2 and the semiconductor portion SEP may have the same size in a plan view. Similar to the semiconductor portion SEP, the second insulating layer PAS2 may be disposed in and across the emission area EMA and the subarea SA of the first subpixel SPX1. The second insulating layer PAS2 may be disposed not to overlap the first and second conductive portions CNE1 and CNE2 and may be arranged between the first and second conductive portions CNE1 and CNE2 in a plan view.

In an embodiment, the second insulating layer PAS2 may be disposed on the oxide semiconductor layer OXL and may be used as a mask for the oxide semiconductor layer OXL in dry-etching the second insulating layer PAS2. Specifically, during the dry etching of the second insulating layer PAS2, portions of the oxide semiconductor layer OXL that are unmasked by the second insulating layer PAS2 may be exposed to plasma so that the oxygen content of the oxide semiconductor layer OXL may decrease. As a result, the unmasked portions of the oxide semiconductor layer OXL may become the conductive portions CNE. A portion of the oxide semiconductor layer OXL that is masked by the second insulating layer PAS2 may become the semiconductive portion SEP. For example, the conductive portions CNE and the semiconductive portion SEP may be formed at the same time using the second insulating layer PAS2 as a mask. Therefore, as the number of mask processes can be reduced, the manufacturing cost of the display device 10 can be reduced. Also, any misalignment or any short circuit that may occur during the patterning of electrodes to contact both end portions of each of the light-emitting elements ED can be prevented.

The first and second insulating layers PAS1 and PAS2 may include an inorganic insulating material or an organic insulating material, but the disclosure is not limited thereto. Although not specifically illustrated in the drawings, another insulating layer may be further disposed on the second insulating layer PAS2 and the oxide semiconductor layer OXL. This insulating layer may protect the elements disposed on the substrate SUB, from an external environment.

Figure 8:
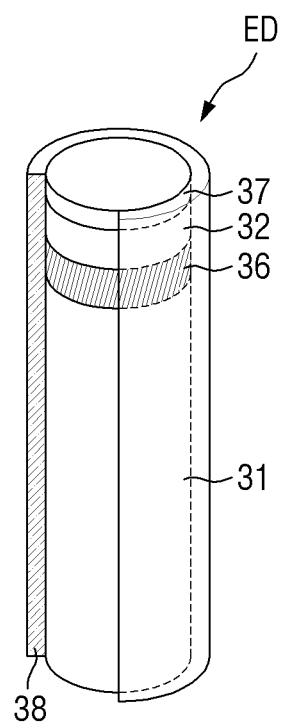
FIG. 8 is a schematic perspective view of a light-emitting element according to an embodiment of the disclosure.

FIG. 8 is a schematic perspective view of a light-emitting element according to an embodiment.

Referring to FIG. 8, a light-emitting element ED may be a light-emitting diode (LED), particularly, an ILED having a size in a range of the nanoscale to microscale and formed of an inorganic material. If an electric field is formed in a particular direction between two opposite electrodes, the light-emitting element ED may be aligned between the two electrodes where polarities are formed.

The light-emitting element ED may extend in a direction. The light-emitting element ED may have the shape of a cylinder, a rod, a wire, or a tube, but the shape of the light-emitting element ED is not particularly limited. As another example, the light-emitting element ED may have the shape of a polygonal column such as a regular cube, a rectangular parallelepiped, or a hexagonal column or may have a shape that extends in a direction but is partially inclined on the outside thereof.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, a light-emitting layer 36, an electrode layer 37, and an insulating film 38.

The first semiconductor layer 31 may include an n-type semiconductor. The first semiconductor layer 31 may include a semiconductor material $Al_xGa_yIn_{1-x-y}N$ (where $0 \le x \le 1$, $0 \le y \le 1$, and $0 \le x+y \le 1$). In an embodiment, the first semiconductor layer 31 may include at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material $Al_xGa_yIn_{1-x-y}N$ (where $0 \le x \le 1$, $0 \le y \le 1$, and $0 \le x+y \le 1$). In an embodiment, the second semiconductor layer 32 may include at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba.

FIG. 8 illustrates that the first and second semiconductor layers 31 and 32 are formed as single layers, but the disclosure is not limited thereto. As another example, each of the first and second semiconductor layers 31 and 32 may include more than one layer such as a clad layer or a tensile strain barrier reducing (TSBR) layer, depending on the material of the light-emitting layer 36.

The light-emitting layer 36 is disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by the combining of electron-hole pairs in response to electrical signals applied thereto via the first and second semiconductor layers 31 and 32. The light-emitting layer 36 may include a material such as AlGaN or AlGaInN. In case that the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

As another example, the light-emitting layer 36 may have a structure in which a semiconductor material having large band gap energy and a semiconductor material having small band gap energy are alternately stacked or may include group III to V semiconductor materials depending on the wavelength of light to be emitted. Light emitted by the light-emitting layer 36 is not particularly limited. The light-emitting layer 36 may also emit light of a red or green wavelength range as necessary, instead of blue light.

The electrode layer 37 may be an ohmic connecting electrode, but the disclosure is not limited thereto. As another example, the electrode layer 37 may be a Schottky connecting electrode. The light-emitting element ED may include at least one electrode layer 37. The light-emitting element ED may include more than one electrode layer 37, but the disclosure is not limited thereto. In some embodiments, the electrode layer 37 may not be provided.

The electrode layer 37 may reduce the resistance between the light-emitting element ED and electrodes or connecting electrodes in case that the light-emitting element ED is electrically connected to the electrodes or the connecting electrodes. The electrode layer 37 may include a conductive metal. In an embodiment, the electrode layer 37 may include at least one of Al, Ti, In, Au, Ag, ITO, IZO, and ITZO.

The insulating film 38 may be disposed to surround the first and second semiconductor layers 31 and 32 and the electrode layer 37. For example, the insulating film 38 may be disposed to surround at least the outer surface of the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as $SiO_x$, $SiN_x$, $SiO_xN_y$, AlN, or $Al_2O_3$. The insulating film 38 is illustrated as being formed as a single layer, but the disclosure is not limited thereto. In some embodiments, the insulating film 38 may be formed as a multilayer in which layers are stacked.

The insulating film 38 may protect elements of the light-emitting element ED. The insulating film 38 can prevent a short circuit that may occur in the light-emitting layer 36 in case that the light-emitting element ED directly contacts electrodes for transmitting electrical signals to the light-emitting element ED. Also, the insulating film 38 can prevent a degradation in the emission efficiency of the light-emitting element ED.

The outer surface of the insulating film 38 may be subjected to surface treatment. The light-emitting element ED may be sprayed on electrodes in a state of being dispersed in predetermined ink. Here, the surface of the insulating film 38 may be hydrophobically or hydrophilically treated to keep the light-emitting element ED dispersed in ink without agglomerating with other neighboring light-emitting elements ED.

The shape of the oxide semiconductor layer OXL of the display device 10 may vary. Display devices according to other embodiments will hereinafter be described.

Figure 9:
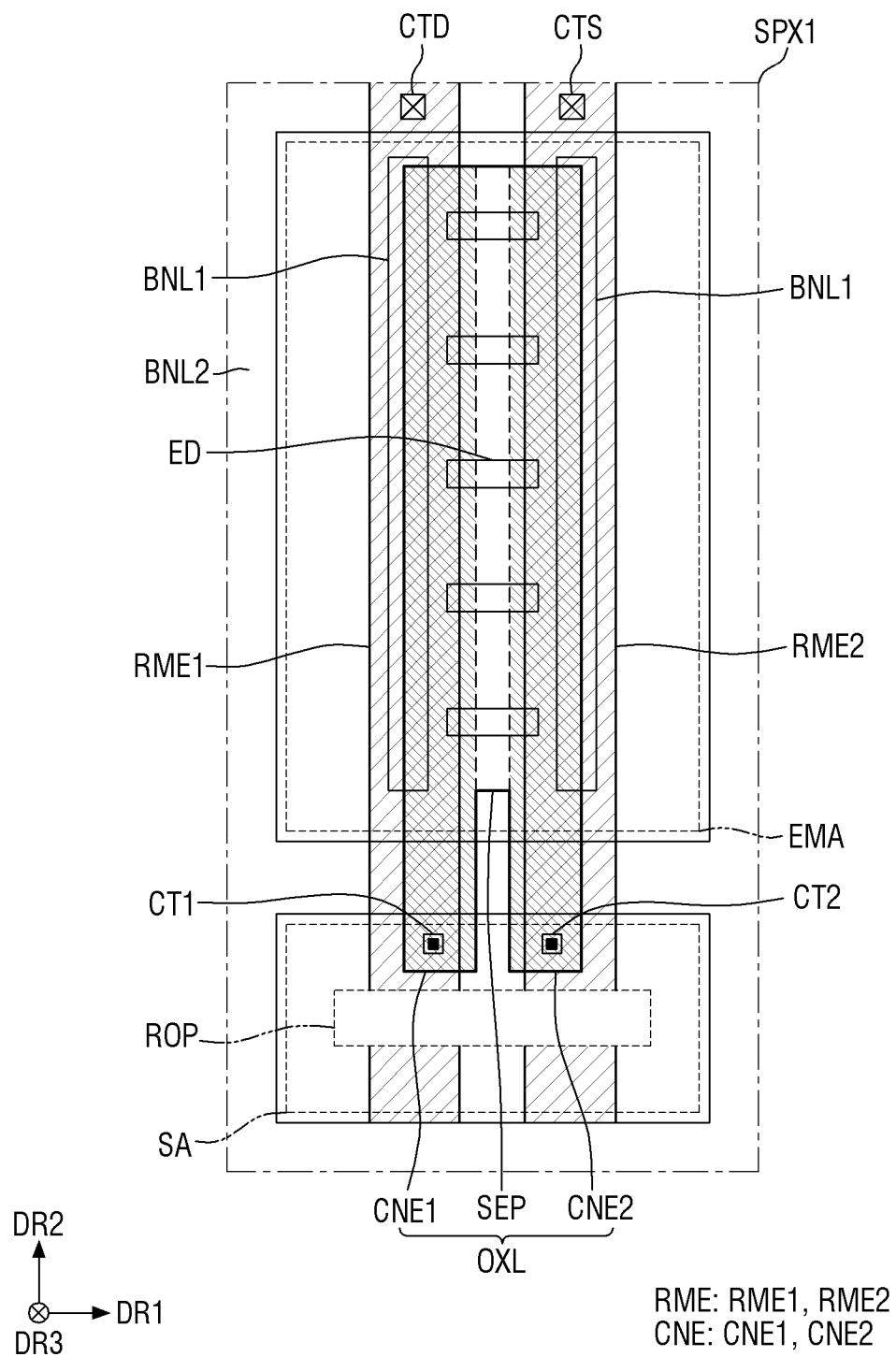
FIG. 9 is a schematic plan view of a subpixel of a display device according to another embodiment of the disclosure.
Figure 10:
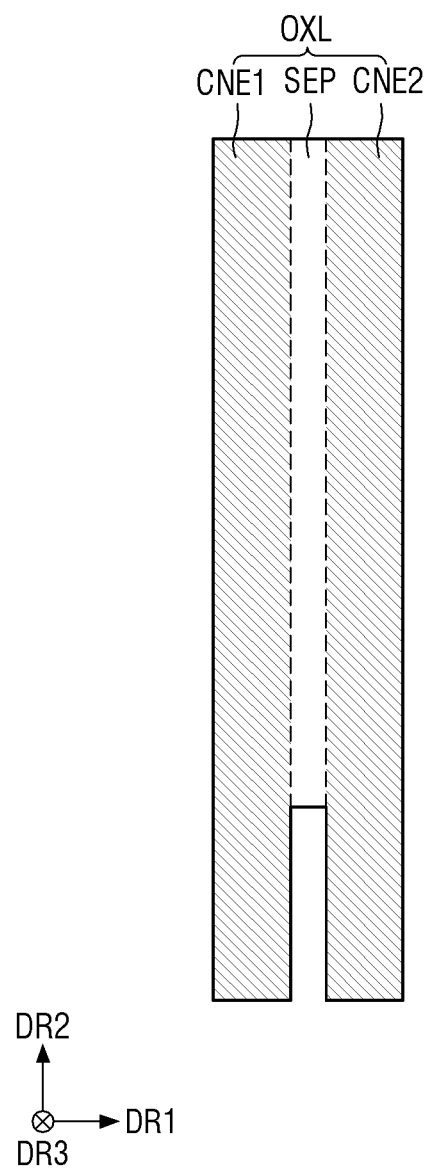
FIG. 10 is a schematic plan view of an oxide semiconductor layer of FIG. 9.

FIG. 9 is a schematic plan view of a subpixel of a display device according to another embodiment. FIG. 10 is a schematic plan view of an oxide semiconductor layer of FIG. 9.

A display device 10 of FIGS. 9 and 10 differs from that of FIGS. 2, 4, and 7 in that the length, in a second direction DR2, of an oxide semiconductor layer OXL is smaller than the length, in the second direction DR2, of conductive portions CNE. The display device 10 of FIGS. 9 and 10 will hereinafter be described, focusing mainly on the differences from the display device 10 of FIGS. 2, 4, and 7.

Referring to FIGS. 9 and 10, a semiconductive portion SEP of the oxide semiconductor layer OXL may be disposed in an emission area EMA of a first subpixel SPX1 and may not overlap a subarea SA of the first subpixel SPX1 and a second bank BNL2. For example, the semiconductive portion SEP may be disposed in the emission area EMA, and the conductive portions CNE of the oxide semiconductor layer OXL may be disposed in the emission area EMA and the subarea SA and may overlap the second bank BNL2.

In a portion of the emission area EMA, the semiconductive portion SEP may be disposed between first and second conductive portions CNE1 and CNE2 to separate the first and second conductive portions CNE1 and CNE2. In a portion of the emission area EMA and the subarea SA, the semiconductive portion SEP may not be disposed, and the first and second conductive portions CNE1 and CNE2 may be physically spaced apart from each other.

The first conductive portion CNE1, the second conductive portion CNE2, and the semiconductive portion SEP may have a predetermined length in the second direction DR2. The first and second conductive portions CNE1 and CNE2 may have the same length. The length of each of the first and second conductive portions CNE1 and CNE2 may be greater than the length of the semiconductive portion SEP. In an embodiment, the resistance of the first and second conductive portions CNE1 and CNE2 may be reduced by reducing the length of the semiconductive portion SEP. Specifically, the resistance at first and second contacts CT1 and CT2 where the conductive portions CNE contact the electrodes RME may be high. Thus, the resistance of the first and second conductive portions CNE1 and CNE2 can be reduced by not providing the semiconductive portion SEP between the emission area EMA and the subarea SA and in the subarea SA.

A second insulating layer PAS2 may be disposed on the oxide semiconductor layer OXL. The second insulating layer PAS2 may overlap the semiconductive portion SEP of the oxide semiconductor layer OXL and may be disposed directly on the semiconductive portion SEP. Specifically, the second insulating layer PAS2 may completely overlap the semiconductive portion SEP, and the second insulating layer PAS2 and the semiconductive portion SEP may have the same size in a plan view. Similar to the semiconductive portion SEP, the second insulating layer PAS2 may be disposed in the emission area EMA and may not overlap the subarea SA and the second bank BNL2.

The conductive portions CNE and the semiconductive portion SEP may be formed during the dry etching of the second insulating layer PAS2. A method of manufacturing a display device according to an embodiment will hereinafter be described.

FIGS. 11 to 17 are schematic cross-sectional views or plan views illustrating a method of manufacturing a display device according to an embodiment. FIGS. 11 to 17 illustrate some of the processes of manufacturing a display device 10.

Figure 11:
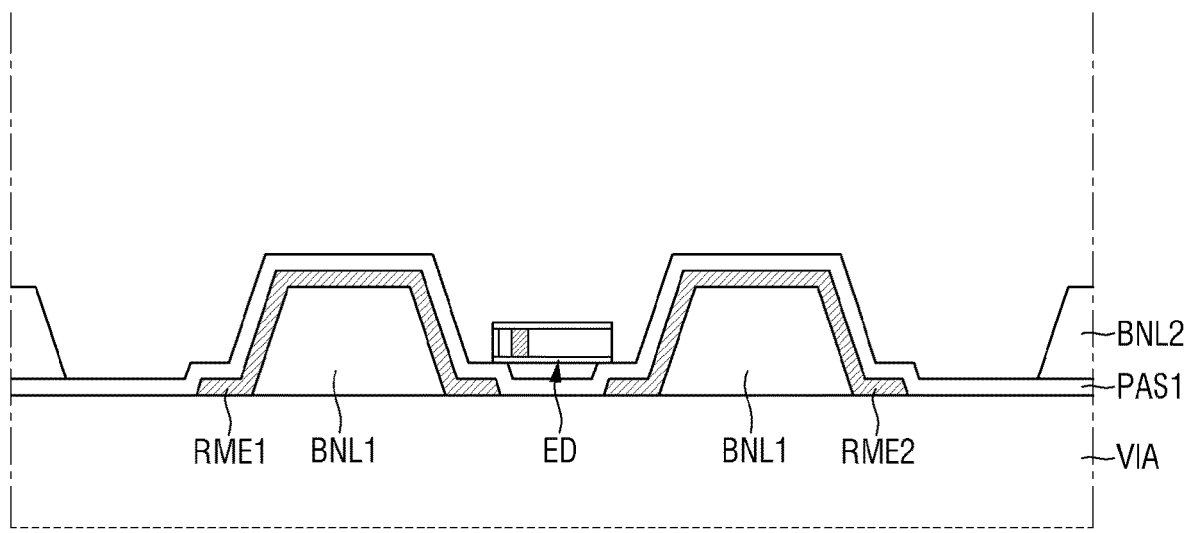
FIGS. 11 through 17 are cross-sectional views or plan views schematically illustrating a method of manufacturing a display device according to an embodiment of the disclosure.
Figure 12:
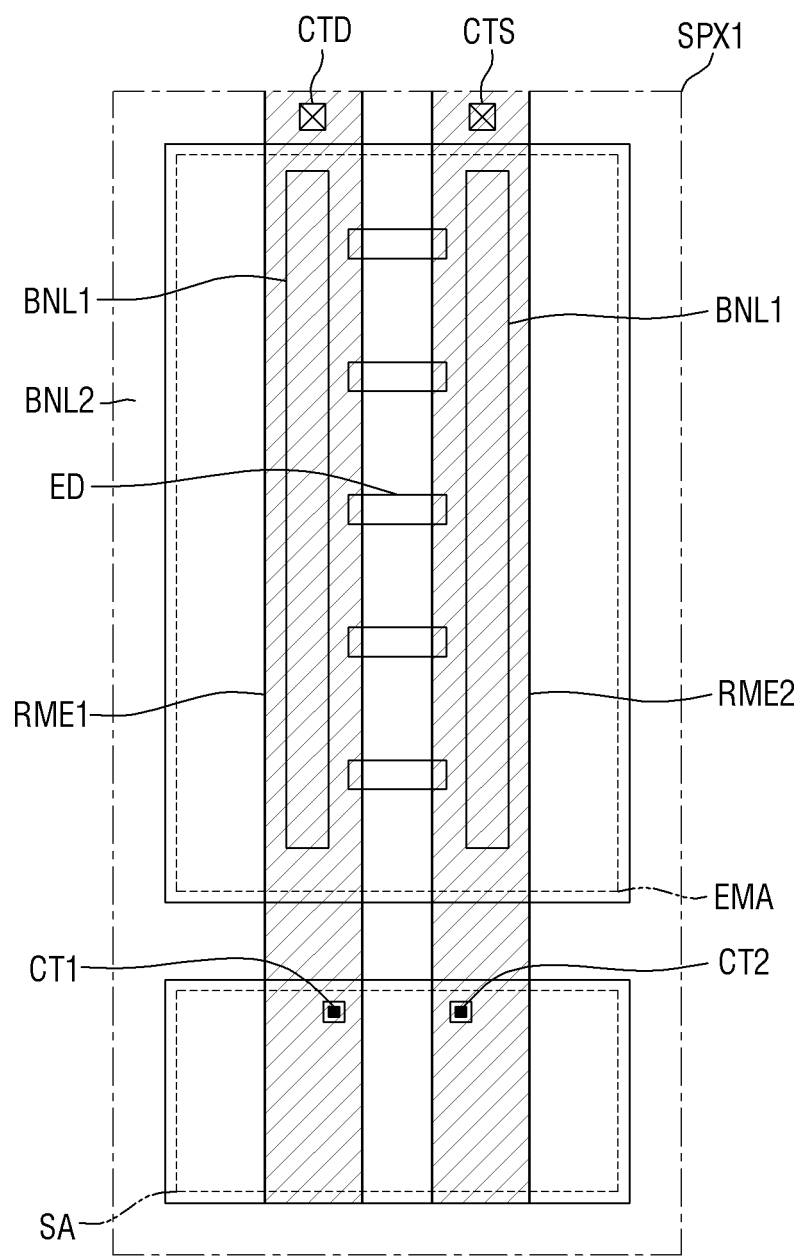

Referring to FIGS. 11 and 12, first banks BNL1, which extend in a direction, is formed on a via layer VIA, and first and second electrode contact holes CTD and CTS are formed by etching the via layer VIA. First and second electrodes RME1 and RME2, which extend in a direction, are formed on the via layer VIA where the first banks BNL1 are formed. The first and second electrodes RME1 and RME2 may be used to align light-emitting elements ED, and a part of them may be separated from each other in a subsequent process. The first and second electrodes RME1 and RME2 may be electrically connected to a third conductive layer disposed therebelow through the first and second electrode contact holes CTD and CTS, respectively. A first insulating layer PAS1 may be formed on the first and second electrodes RME1 and RME2, and first and second contacts CT1 and CT2, which expose the first and second electrodes RME1 and RME2, are formed. The first insulating layer PAS1 may be disposed on the entire surface of the via layer VIA to cover (or overlap) the first and second electrodes RME1 and RME2. Thereafter, a second bank BNL2 is formed on the first insulating layer PAS1. The emission area EMA and the subarea SA may be defined by the second bank BNL2.

Thereafter, ink including light-emitting elements ED is sprayed onto portions of the first insulating layer PAS1 surrounded by the second bank BNL2 by an inkjet printing device. The ink may include light-emitting elements ED, and the light-emitting elements ED may be dispersed in the ink in a state of being arranged in random directions. Then, the light-emitting elements ED are aligned by applying alignment signals to the first and second electrodes RME1 and RME2 to generate an electric field. The light-emitting elements ED may receive a dielectrophoretic force from the electric field and may be disposed on the first and second electrodes RME1 and RME2 as the alignment directions and the locations of the light-emitting elements ED change.

In case that an electric field is generated, the light-emitting elements ED may receive a dielectrophoretic force. If the electric field is generated in parallel to the top surface of the via layer VIA, the light-emitting elements ED may be aligned to be parallel to the via layer VIA and may thus be placed on the first and second electrodes RME1 and RME2. The light-emitting elements ED may move from their initial locations toward the first and second electrodes RME1 and RME2 by the dielectrophoretic force. As the alignment directions and the locations of the light-emitting elements ED change, both end portions of each of the light-emitting elements ED may be placed on the first and second electrodes RME1 and RME2. Each of the light-emitting elements ED may include semiconductor layers that are doped with dopants of different conductivities and may have dipole moments. As the light-emitting elements ED having dipole moments are placed on the electric field, the light-emitting elements ED may be aligned by the dielectrophoretic force so that both end portions of each of the light-emitting elements ED may be placed on the first and second electrodes RME1 and RME2.

Figure 13:
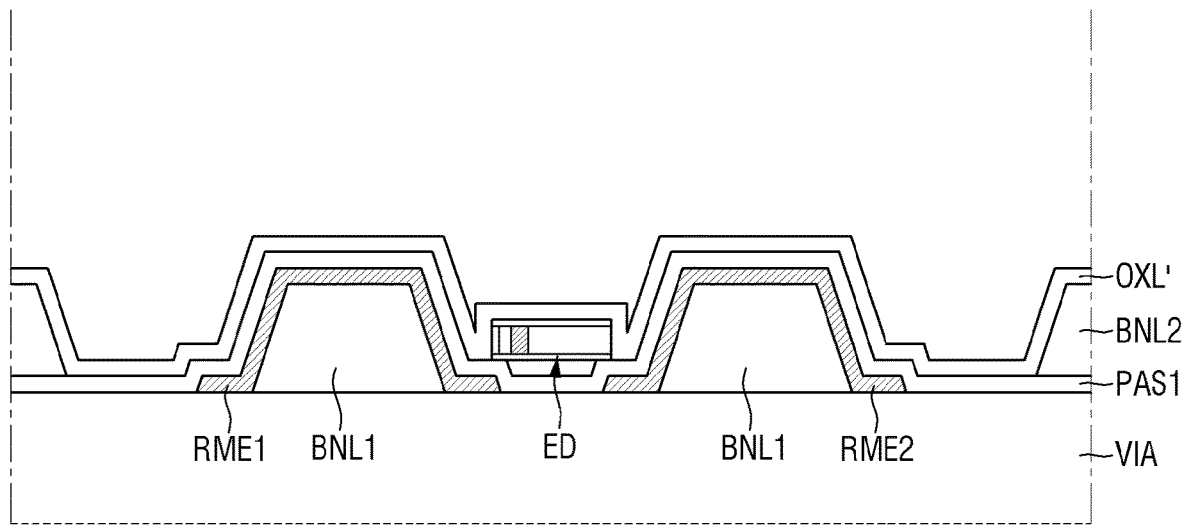
Figure 14:
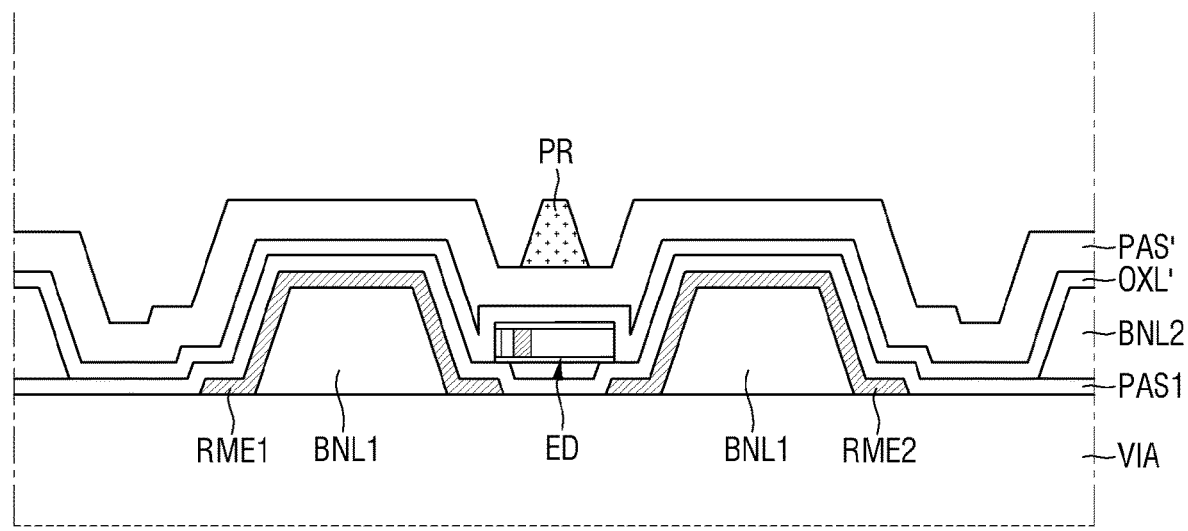

Thereafter, referring to FIGS. 13 and 14, an oxide semiconductor material layer OXL' is stacked on the portion of the first insulating layer PAS1 surrounded by the second bank BNL2 and on the light-emitting elements ED. In an embodiment, the oxide semiconductor material layer OXL' may be formed of IGZO. Thereafter, an insulating material layer PAS' is stacked on the oxide semiconductor material layer OXL'. The oxide semiconductor material layer OXL' and the insulating material layer PAS' are formed on the entire surface of the via layer VIA.

Thereafter, a mask pattern PR is formed by applying photoresist onto the insulating material layer PAS' and exposing and developing the photoresist. The mask pattern PR may be formed to overlap the light-emitting elements ED and extend in a direction. The mask pattern PR may correspond to a region where a semiconductive portion SEP is to be formed.

Figure 15:
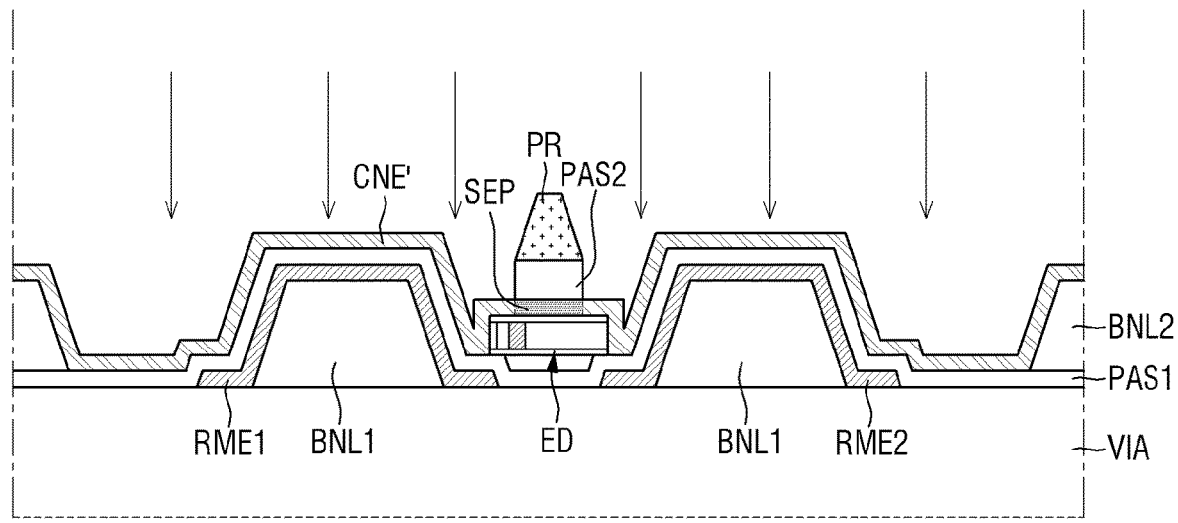

Thereafter, referring to FIG. 15, the insulating material layer PAS' is dry-etched using the mask pattern PR as a mask. Specifically, the insulating material layer PAS' may be plasma-dry-etched using plasma treatment. As a result, portions of the insulating material layer PAS' that are unmasked by the mask pattern PR may be removed, and a portion of the insulating material layer PAS' that overlaps the mask pattern PR may form a second insulating layer PAS2.

As the insulating material layer PAS' is etched, the oxide semiconductor material layer OXL' is exposed below the insulating material layer PAS'. As the dry etching of the insulating material layer PAS' is continued, the oxide semiconductor material layer OXL' may be plasma-treated so that the oxygen content of the oxide semiconductor material layer OXL' may decrease. As a result, the oxide semiconductor material layer OXL' may be metalized to have the properties of a conductor. For example, the oxide semiconductor material layer OXL' may be metalized by plasma treatment, and as a result, a conductive layer CNE' may be formed. A portion of the oxide semiconductor material layer OXL' that is masked by the second insulating layer PAS2 may maintain its semiconductor properties and may thus form the semiconductive portion SEP. Once the dry etching of the oxide semiconductor material layer OXL' is complete, the mask pattern PR is removed.

Figure 16:
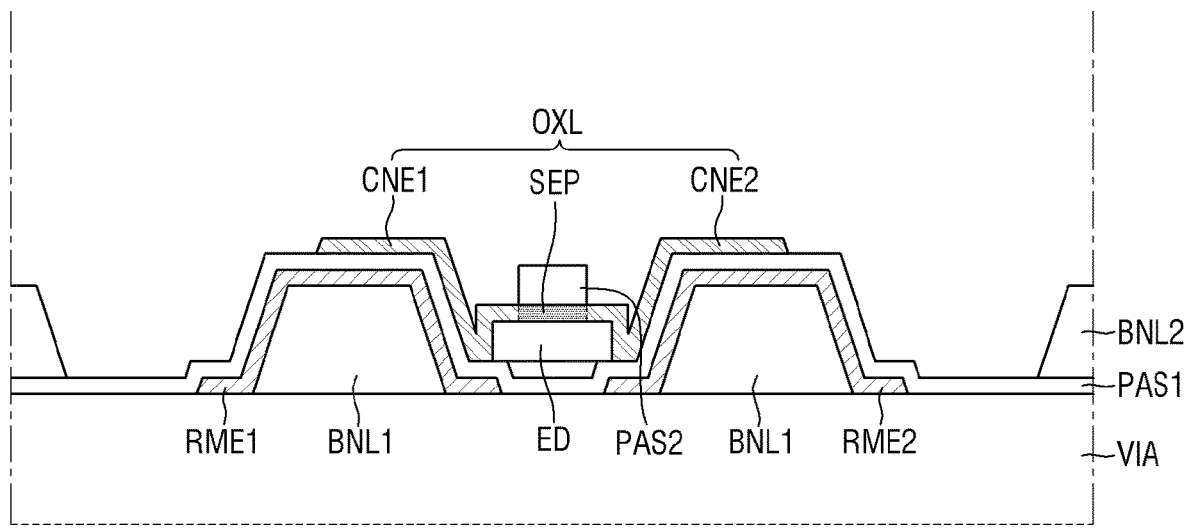
Figure 17:
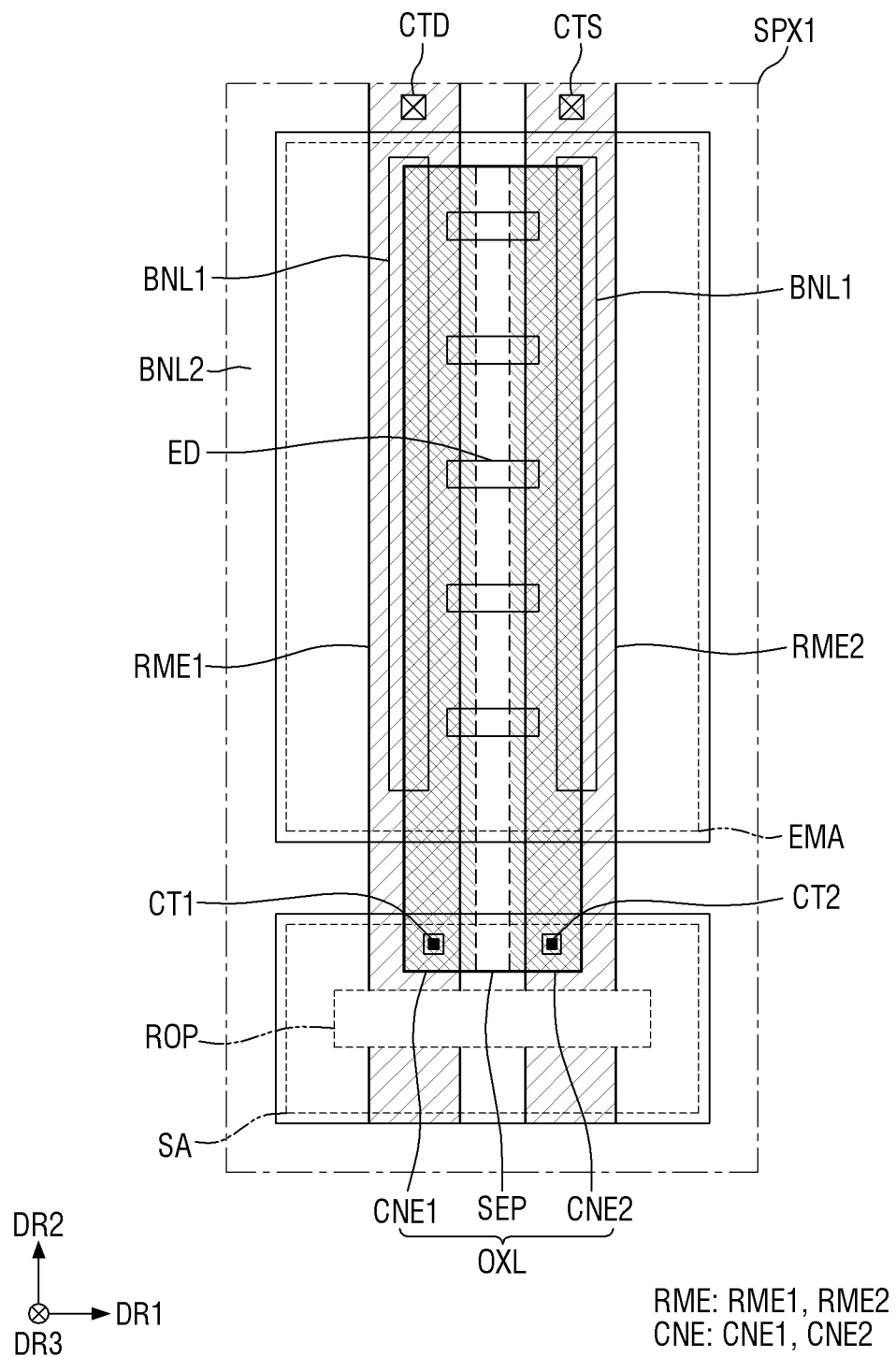

Thereafter, referring to FIGS. 16 and 17, the conductive layer CNE' of the oxide semiconductor material layer OXL' is patterned by photolithography, thereby forming an oxide semiconductor layer OXL including a first conductive portion CNE1, a second conductive portion CNE2, and the semiconductive portion SEP. Simultaneously, the first and second electrodes RME1 and RME2 may be separated by a separation part ROP of the subarea SA. The first conductive portion CNE1 may contact first end portions of the light-emitting elements ED, and the second conductive portion CNE2 may contact second end portions of the light-emitting elements ED.

In an embodiment, the first and second conductive portions CNE1 and CNE2 and the semiconductive portion SEP may be formed at the same time using the second insulating layer PAS2 as a mask. Thus, as the number of mask processes can be reduced, the manufacturing cost of the display device 10 can be reduced. Also, any misalignment or any short circuit that may occur during the patterning of electrodes to contact both end portions of each of the light-emitting elements ED can be prevented.

Figure 18:
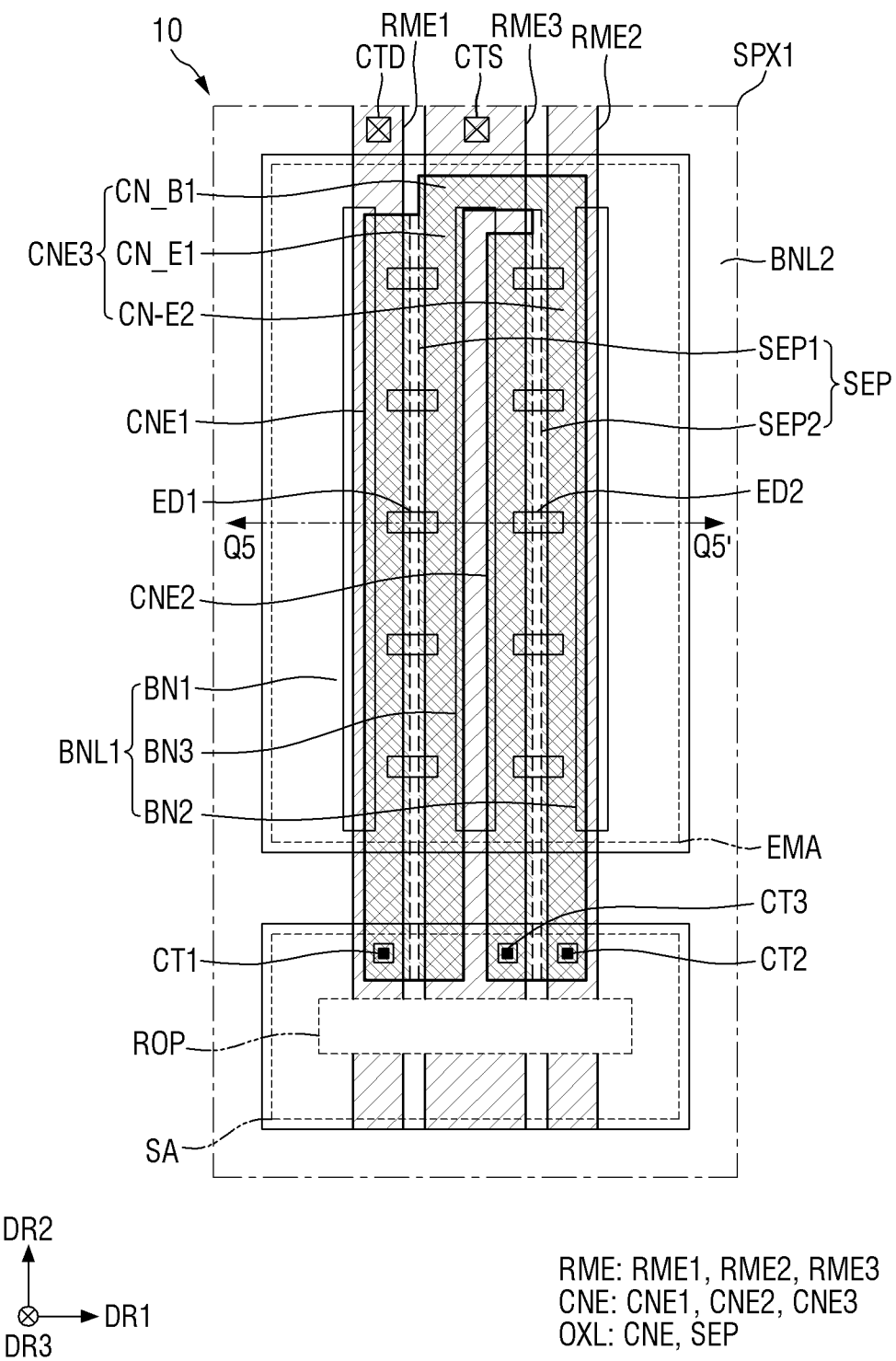
FIG. 18 is a schematic plan view of a subpixel of a display device according to another embodiment of the disclosure.
Figure 19:
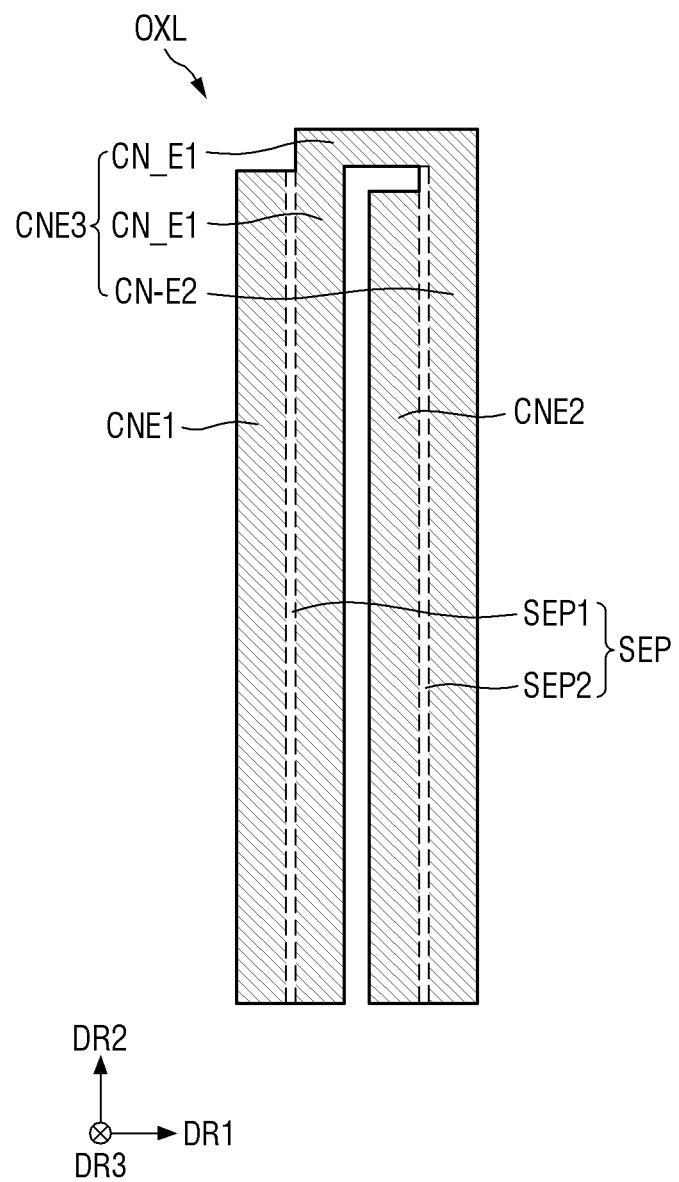
FIG. 19 is a schematic plan view of an oxide semiconductor layer of FIG. 18.
Figure 20:
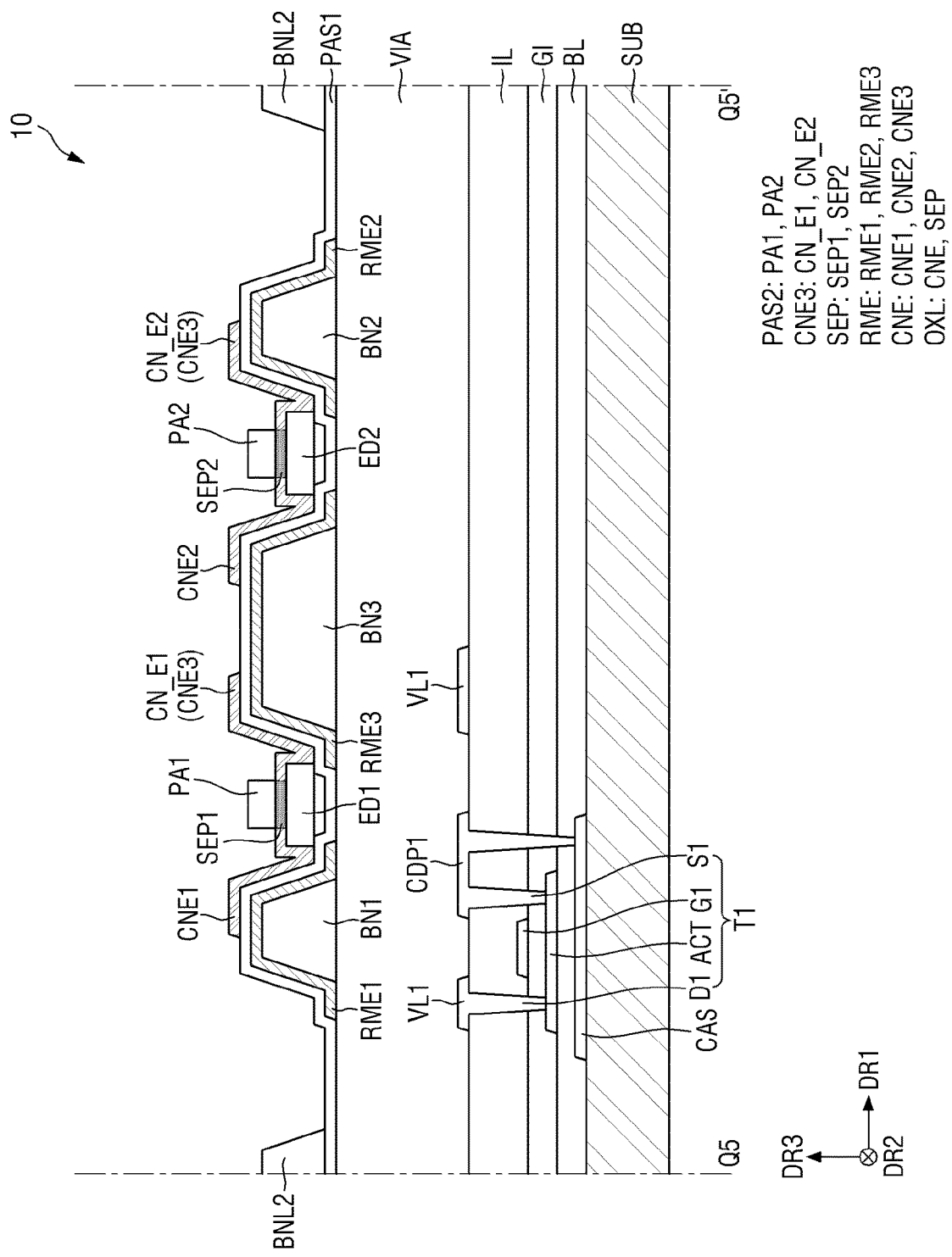
FIG. 20 is a schematic cross-sectional view taken along line Q5-Q5' of FIG. 18.

FIG. 18 is a schematic plan view of a subpixel of a display device according to another embodiment. FIG. 19 is a schematic plan view of an oxide semiconductor layer of FIG. 18. FIG. 20 is a schematic cross-sectional view taken along line Q5-Q5' of FIG. 18.

Referring to FIGS. 18 to 20, a display device 10 may include, in each subpixel SPXn, more electrodes RME than in any one of the previous embodiments, and the number of light-emitting elements ED disposed in each subpixel SPXn may increase. As a result, the shape of an oxide semiconductor layer OXL may be modified to prevent the misalignment of electrodes that contact the light-emitting elements ED.

First banks BNL1 may include first and second bank parts BN1 and BN2 and may further include a third bank part BN3, which have a different width from the first and second bank parts BN1 and BN2. The third bank part BN3 may be disposed between the first and second bank parts BN1 and BN2 and may extend in a second direction DR2. The first, second, and third bank parts BN1, BN2, and BN3 may have the same length in the second direction DR2, but the third bank part BN3 may have a width greater than that of the first and second bank parts BN1 and BN2 in a first direction DR1.

The third bank part BN3 may be spaced apart from the first and second bank parts BN1 and BN2 in the first direction DR1. The third bank part BN3 may have a width greater than that of the first bank part BN1 so that a third electrode RME3 may be disposed on the third bank part BN3. Light-emitting elements ED may be disposed between the first and third bank parts BN1 and BN3 and between the second and third bank parts BN2 and BN3.

As already described above with reference to FIGS. 4 and 5, a first electrode RME1 may be disposed on the first bank part BN1, and a second electrode RME2 may be disposed on the second bank part BN2.

The third electrode RME3 may be disposed on the third bank part BN3. The third electrode RME3 may extend in the second direction DR2, between the first and second electrodes RME1 and RME2, and may be disposed in and across an emission area EMA and a subarea SA of a first subpixel SPX1. In some embodiments, the width of the third electrode RME3 may be greater than the width of the first and second electrodes RME1 and RME2 and the width of the third bank part BN3. The third electrode RME3 may be disposed to cover (or overlap) both side surfaces of the third bank part BN3 and may be spaced apart from, and face, the first and second electrodes RME1 and RME2 in the first direction DR1.

Similar to the first electrode RME1, the third electrode RME3 may be electrically connected to a third conductive layer below a via layer VIA. The third electrode RME3 may be electrically connected to a second voltage line VL2 through a second electrode contact hole CTS, which is formed in an area that overlaps a second bank BNL2 in a thickness direction. The second electrode RME2, unlike the first and third electrodes RME1 and RME3, may not be electrically connected to the third conductive layer. The second electrode RME2 may be electrically connected to a second conductive portion CNE2, and electrical signals flowing along the light-emitting elements ED may be applied to the second electrode RME2. As will be described below, the second electrode RME2 may provide an electrical connection path for the light-emitting elements ED, together with the second conductive portion CNE2.

The light-emitting elements ED may be disposed between the first and third bank parts BN1 and BN3 and between the second and third bank parts BN2 and BN3. The light-emitting elements ED disposed between the first and third bank parts BN1 and BN3, e.g., first light-emitting elements ED1, may have first end portions disposed on the first electrode RME1 and second end portions disposed on a first side of the third electrode RME3. The light-emitting elements ED disposed between the second and third bank parts BN2 and BN3, e.g., second light-emitting elements ED2, may have first end portions disposed on the second electrode RME2 and second end portions disposed on a second side of the third electrode RME3. In an embodiment, the direction faced by the first end portions of the first light-emitting elements ED1 may be opposite to the direction faced by the second end portions of the second light-emitting elements ED2.

The oxide semiconductor layer OXL may include conductive portions CNE, which include first, second, and third conductive portions CNE1, CNE2, and CNE3, and semiconductive portions SEP, which include first and second semiconductive portions SEP1 and SEP2. The first, second, and third conductive portions CNE1, CNE2, and CNE3 and the first and second semiconductive portions SEP1 and SEP2 may correspond to sections of the oxide semiconductor layer OXL and may be formed in a body.

The conductive portions CNE may include the first conductive portion CNE1, which is disposed on the first electrode RME1, the second conductive portion CNE2, which is disposed on the second side of the third electrode RME3, and the third conductive portion CNE3, which is disposed on the first side of the third electrode RME3 and on the second electrode RME2.

The first conductive portion CNE1 may contact the first electrode RME1 and the first end portions of the first light-emitting elements ED1. The first conductive portion CNE1 may contact the first electrode RME1 through a first contact CT1, which penetrates the first insulating layer PAS1. The second conductive portion CNE2 may contact the third electrode RME3 and the second end portions of the second light-emitting elements ED. The second conductive portion CNE2 may contact the third electrode RME3 through a third contact CT3, which penetrates the first insulating layer PAS1. The first and second conductive portions CNE1 and CNE2 may extend in the second direction DR2 from the emission area EMA to the subarea SA.

The third conductive portion CNE3 may include a first extension CN_E1, which is disposed on the first side of the third electrode RME3 and extends in the second direction DR2, a second extension CN_E2, which is disposed on the second electrode RME2 and extends in the second direction DR2, and a first connector CN_B1, which connects the first and second extensions CN_E1 and CN_E2. The first and second extensions CN_E1 and CN_E2 of the third conductive portion CNE3 may be spaced apart from each other in the first direction DR1 by the second conductive portion CNE2. The first extension CN_E1 may be spaced apart from, and face, the first conductive portion CNE1, and the second extension CN_E2 may be spaced apart from, and face, the second conductive portion CNE2. The first extension CN_E1 may contact the second end portions of the first light-emitting elements ED1, and the second extension CN_E2 may contact the first end portions of the second light-emitting elements ED2.

The first connector CN_B1 may extend in the first direction DR1 in the emission area EMA and may connect the first and second extensions CN_E1 and CN_E2. The first and second extensions CN_E1 and CN_E2 of the third conductive portion CNE3 may extend from the emission area EMA to the subarea SA, and the second extension CN_E2 may be electrically connected to the second electrode RME2 through a second contact CT2, which penetrates the first insulating layer PAS1.

The first semiconductive portion SEP1 may be disposed between the first extension CN_E1 of the third conductive portion CNE3 and the first conductive portion CNE1 and may separate the first extension CN_E1 of the third conductive portion CNE3 and the first conductive portion CNE1. The second semiconductive portion SEP2 may be disposed between the second extension CN_E2 of the third conductive portion CNE3 and the second conductive portion CNE2 and may separate the second extension CN_E2 of the third conductive portion CNE3 and the second conductive portion CNE2. As already described above, as portions of the oxide semiconductor layer OXL are metalized during the dry etching of the second insulating layer PAS2, the conductive portions CNE are formed, and portions of the oxide semiconductor layer OXL that are masked by the second insulating layer PAS2 may be formed as the semiconductive portions SEP. The oxygen content of the first, second, and third conductive portions CNE1, CNE2, and CNE3 may be lower than the oxygen content of the first and second semiconductive portions SEP1 and SEP2.

The semiconductive portions SEP may be disposed on the first insulating layer PAS1 and the light-emitting elements ED to cover (or overlap) the light-emitting elements ED. The first semiconductive portions SEP1 may cover the first light-emitting elements ED1 and may not cover both end portions of each of the first light-emitting elements ED1. The second semiconductive portion SEP2 may cover the second light-emitting elements ED2 and may not cover both end portions of each of the second light-emitting elements ED2.

The semiconductive portions SEP may extend from the emission area EMA to the subarea SA. The length, in the second direction DR2, of the first semiconductive portion SEP1 may be equal to the length, in the second direction DR2, of the first conductive portion CNE1. The length, in the second direction DR2, of the second semiconductive portion SEP2 may be greater than the length, in the second direction DR2, of the second conductive portion CNE2. The second semiconductive portion SEP2 may be longer than the first semiconductive portion SEP1. However, the disclosure is not limited thereto. The length of the semiconductive portions SEP and the length of the conductive portions CNE may vary depending on the shape of the subpixel SPXn.

The second insulating layer PAS2 may be disposed on the oxide semiconductor layer OXL. The second insulating layer PAS2 may include first and second insulating portions PA1 and PA2, which are spaced from each other and overlap the first and second semiconductive portions SEP1 and SEP2, respectively. The first insulating portion PA1 may overlap the first light-emitting elements ED1 and may be disposed directly on the first semiconductive portion SEP1. The second insulating portion PA2 may overlap the second light-emitting elements ED2 and may be disposed directly on the second semiconductive portion SEP2. In an embodiment, the first insulating portion PA1 may completely overlap the first semiconductive portion SEP1, the first insulating portion PA1 and the first semiconductive portion SEP1 and may have the same size in a plan view, and the second insulating portion PA2 may completely overlap the second semiconductive portion SEP2, and the second insulating portion PA2 and the second semiconductive portion SEP2 may have the same size in a plan view.

Similar to the semiconductive portions SEP, the second insulating layer PAS2 may be disposed in and across the emission area EMA and the subarea SA. The first insulating portion PA1 of the second insulating layer PAS2 may not overlap the first and third conductive portions CNE1 and CNE3, and the second insulating portion PA2 of the second insulating layer PAS2 may not the second and third conductive portions CNE2 and CNE3.

The first end portions of the first light-emitting elements ED1 may be electrically connected to the first electrode RME1 via the first conductive portion CNE1, and the second end portions of the second light-emitting elements ED2 may be electrically connected to the third electrode RME3 via the second conductive portion CNE2. The second end portions of the first light-emitting elements ED1 and the first end portions of the second light-emitting elements ED2 may be electrically connected in series via the third conductive portion CNE3. The light-emitting elements ED may be electrically connected in parallel, and the first light-emitting elements ED1 and the second light-emitting elements ED2 may be electrically connected in series via the third conductive portion CNE3. Unlike the display device 10 in the embodiment of FIG. 4, the display device 10 in the embodiments of FIGS. 18 to 20 includes a relatively larger number of light-emitting elements ED in each subpixel SPXn and has serial connections between the light-emitting elements ED. Thus, the amount of light emitted per unit area can be increased.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode and a second electrode disposed on a substrate, the first and second electrodes extending in a first direction in parallel to each other;
   a first insulating layer disposed on the first and second electrodes;
   light-emitting elements disposed on the first insulating layer, the light-emitting elements including:
      first end portions disposed on the first electrode; and
      second end portions disposed on the second electrode;
   an oxide semiconductor layer disposed on the first insulating layer and the light-emitting elements, the oxide semiconductor layer including:
      a first conductive portion electrically contacting the first end portions of the light-emitting elements;
      a second conductive portion electrically contacting the second end portions of the light-emitting elements; and
      a semiconductive portion disposed between the first and second conductive portions; and
   a second insulating layer disposed on the oxide semiconductor layer.

2. The display device of claim 1, wherein the first conductive portion, the second conductive portion, and the semiconductive portion overlap the light-emitting elements and are integral with each other.

3. The display device of claim 1, wherein an oxygen content of each of the first and second conductive portions is lower than an oxygen content of the semiconductive portion.

4. The display device of claim 1, wherein
   the first and second conductive portions are spaced apart from each other, and
   the semiconductive portion is disposed between the first and second conductive portions.

5. The display device of claim 1, wherein the first conductive portion, the second conductive portion, and the semiconductive portion have a same length in the first direction.

6. The display device of claim 1, wherein a length of each of the first and second conductive portions in the first direction is greater than a length of the semiconductive portion in the first direction.

7. The display device of claim 1, wherein
a width of the first and second conductive portions in a second direction is greater than a width of the semiconductive portion in a second direction, and
the second direction is a direction that intersects the first direction.

8. The display device of claim 7, wherein the width of the semiconductive portion is smaller than a length of the light-emitting elements.

9. The display device of claim 1, wherein
the semiconductive portion overlaps the second insulating layer, and
the semiconductive portion does not overlap the first end portions and the second end portions of the light-emitting elements.

10. The display device of claim 9, wherein a planar size of the semiconductive portion is equal to a planar size of the second insulating layer.

11. The display device of claim 1, wherein each of the first and second conductive portions do not overlap the second insulating layer.

12. The display device of claim 1, further comprising:
first banks overlapping the first and second electrodes and extending in the first direction; and
a second bank defining an emission area where the light-emitting elements are disposed and a subarea spaced apart from the emission area in the first direction,
wherein the first and second conductive portions are disposed in and across the emission area and the subarea.

13. The display device of claim 12, wherein
the semiconductive portion is disposed in the emission area, and
the semiconductive portion is not disposed in the subarea.

* * * * *